(12) United States Patent
Leng

(10) Patent No.: US 12,439,614 B2
(45) Date of Patent: Oct. 7, 2025

(54) MULTI-CAPACITOR MODULE INCLUDING A STACKED METAL-INSULATOR-METAL (MIM) STRUCTURE

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 521 days.

(21) Appl. No.: 17/881,064

(22) Filed: Aug. 4, 2022

(65) Prior Publication Data

US 2024/0006472 A1    Jan. 4, 2024

Related U.S. Application Data

(60) Provisional application No. 63/356,607, filed on Jun. 29, 2022.

(51) Int. Cl.
| | |
|---|---|
| *H01L 23/522* | (2006.01) |
| *H10B 12/00* | (2023.01) |
| *H10D 1/00* | (2025.01) |
| *H10D 1/68* | (2025.01) |

(52) U.S. Cl.
CPC ......... *H10D 1/042* (2025.01); *H01L 23/5223* (2013.01); *H10B 12/038* (2023.02); *H10B 12/0387* (2023.02); *H10B 12/37* (2023.02); *H10D 1/043* (2025.01); *H10D 1/696* (2025.01); *H10D 1/716* (2025.01)

(58) Field of Classification Search
CPC ............... H01L 28/75; H01L 28/90–92; H01L 23/5223; H10B 12/038; H10B 12/0387; H10B 12/37; H10D 1/042; H10D 1/716
See application file for complete search history.

(56) References Cited

U.S. PATENT DOCUMENTS

| 12,021,115 B2 * | 6/2024 | Leng ................... H10B 12/038 |
| 2002/0030216 A1 | 3/2002 | Adkisson et al. ............ 257/306 |

(Continued)

OTHER PUBLICATIONS

International Search Report and Written Opinion, Application No. PCT/US2022/053777, 12 pages, Mar. 28, 2023.

*Primary Examiner* — Jose R Diaz
(74) *Attorney, Agent, or Firm* — SLAYDEN GRUBERT BEARD PLLC

(57) ABSTRACT

A multi-capacitor module includes a stacked metal-insulator-metal (MIM) structure including a cup-shaped first electrode, a cup-shaped first insulator formed over the cup-shaped first electrode, a cup-shaped second electrode formed over the cup-shaped first insulator, a cup-shaped second insulator formed over the cup-shaped second electrode, a third electrode formed over the cup-shaped second insulator. The stacked MIM structure also includes a first sidewall spacer located between the cup-shaped first electrode and the cup-shaped second electrode, and a second sidewall spacer located between the cup-shaped second electrode and the third electrode. The cup-shaped first electrode, the cup-shaped second electrode, and the cup-shaped first insulator define a first capacitor, and the cup-shaped second electrode, the third electrode, and the cup-shaped second insulator define a second capacitor.

23 Claims, 20 Drawing Sheets

(56) References Cited

U.S. PATENT DOCUMENTS

| | | | |
|---|---|---|---|
| 2007/0152258 A1* | 7/2007 | Kim | H01L 23/5223 |
| | | | 257/E21.011 |
| 2012/0080771 A1* | 4/2012 | Yang | H01L 28/91 |
| | | | 257/532 |
| 2017/0104057 A1 | 4/2017 | Voiron | 257/534 |
| 2021/0313116 A1* | 10/2021 | Verma | G01G 4/012 |
| 2022/0069069 A1 | 3/2022 | Leng et al. | |
| 2023/0071686 A1* | 3/2023 | Verma | H01G 4/33 |

\* cited by examiner

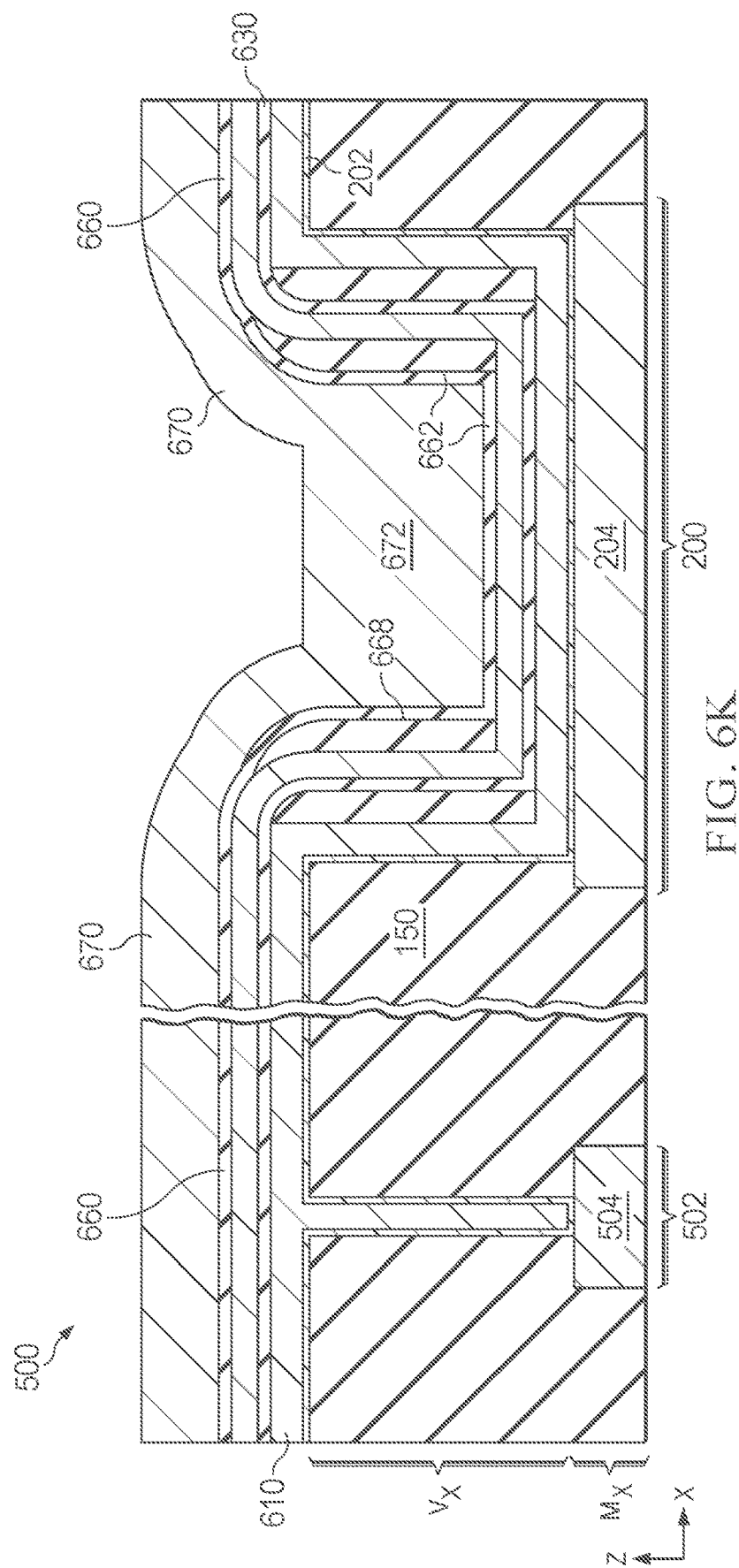

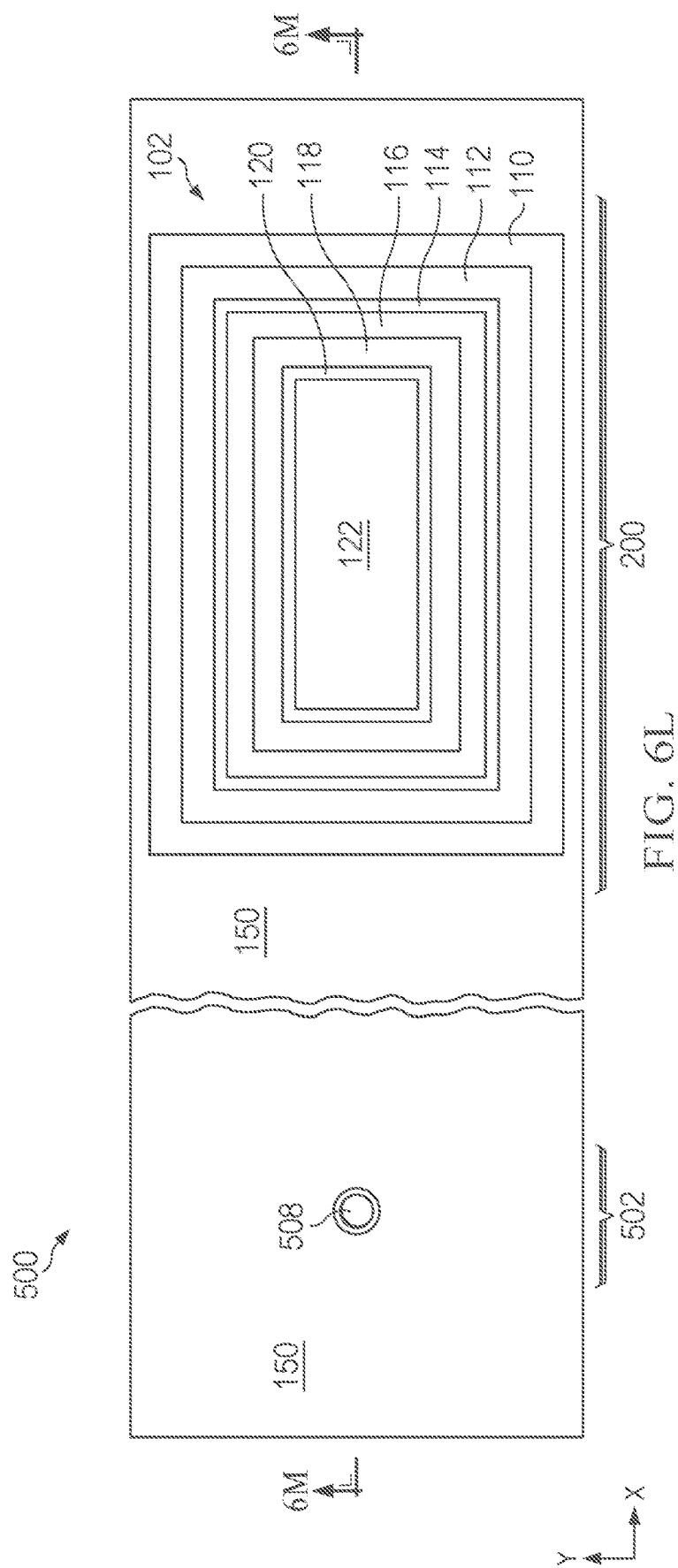

MULTI-CAPACITOR MODULE INCLUDING A STACKED METAL-INSULATOR-METAL (MIM) STRUCTURE

RELATED PATENT APPLICATION

This application claims priority to commonly owned U.S. Provisional Patent Application No. 63/356,607 filed Jun. 29, 2022, the entire contents of which are hereby incorporated by reference for all purposes.

TECHNICAL FIELD

The present disclosure relates to capacitors formed in integrated circuit structures, and more particularly, to a multi-capacitor module including a stacked metal-insulator-metal (MIM) structure.

BACKGROUND

A metal-insulator-metal (MIM) capacitor is a capacitor constructed with a metal top electrode, a metal bottom electrode, and an insulator (dielectric) sandwiched between the two electrodes.

MIM capacitors are important components in many electrical circuits, for example many analog, mixed-signal, and radio-frequency complementary metal-oxide semiconductors (RF CMOS) circuits. MIM capacitors often provide better performance than alternatives, such as POP (poly-oxide-poly) capacitors and MOM (metal-oxide-metal lateral flux) capacitors, due to lower resistance, better matching for analog circuits (e.g., matching device characteristics such as resistance and capacitance), and/or better signal/noise ratio.

MIM capacitors are typically constructed between two metal layers (e.g., aluminum interconnect layers), referred to as metal layers $M_x$ and $M_{x+1}$. For example, construction of a conventional MIM capacitor may include forming a bottom electrode (bottom plate) in a metal layer $M_x$, constructing an insulator (dielectric) and a top electrode (top plate) over the bottom electrode, and connecting an overlying metal layer $M_{x+1}$ to the top and bottom electrodes by respective vias. The top electrode formed between the two metal layers $M_x$ and $M_{x+1}$ may be formed from a different metal than the metal layers $M_x$ and $M_{x+1}$. For example, the metal layers $M_x$ and $M_{x+1}$ may be formed from aluminum, whereas the top electrode may be formed from titanium/titanium nitride (Ti/TiN), tantalum/tantalum nitride (Ta/TaN), or tungsten (W), for example.

Conventional MIM capacitors are relatively expensive to build, requiring one or more additional mask layers to the background fabrication process.

In conventional MIM capacitor design, selecting the thickness of the insulator (dielectric) may involve a trade-off between (a) capacitance value of the MIM capacitor, where capacitance is inversely proportional to the insulator thickness and (b) breakdown voltage, where breakdown voltage is proportional to the insulator thickness.

The conventional MIM capacitor, and a MIM capacitor module comprising the conventional MIM capacitor, may suffer from various shortcomings. For example, the thickness of the top electrode may be limited due to a vertical spacing limitation between the two metal layers $M_x$ and $M_{x+1}$, which may result in high serial resistance unsuitable for certain applications (e.g., RF applications).

There is a need for improved MIM capacitor modules and formation processes.

SUMMARY

A multi-capacitor module includes a stacked metal-insulator-metal (MIM) structure including two or more capacitors formed in a physically stacked arrangement. In some examples, the stacked MIM capacitor structure includes a series of electrodes and insulators formed in a tub opening to define two or more capacitors arranged in a vertically stacked manner.

In some examples, the stacked MIM structure of the multi-capacitor module includes (a) a first capacitor including a first cup-shaped insulator arranged between a first cup-shaped electrode and a second cup-shaped electrode and (b) a second capacitor including a second cup-shaped insulator arranged between the second cup-shaped electrode and a third electrode. The first and second cup-shaped insulators include a respective laterally-extending insulator base and a respective vertically-extending insulator sidewall extending upwardly from the respective laterally-extending insulator base. The stacked MIM structure may include (a) a first dielectric sidewall spacer formed between a vertically-extending sidewall of the first cup-shaped insulator and a vertically-extending sidewall of the first cup-shaped electrode and (b) a second dielectric sidewall spacer formed between a vertically-extending sidewall of the second cup-shaped insulator and the third electrode, to prevent or reduce capacitive coupling through the vertically-extending insulator sidewalls of the first and second cup-shaped insulators. As a result, capacitive coupling occurs fully or predominantly through the respective laterally-extending insulator bases of the respective first and second cup-shaped capacitors, thereby effective defining the first and second capacitors as planar capacitors.

In addition, as discussed below, the respective dielectric sidewall spacers may allow the first and second capacitors of the multi-capacitor module to be selectively connected electrically in series (e.g., to reduce the breakdown voltage of the multi-capacitor module) or in parallel (e.g., to increase the capacitance value of the multi-capacitor module).

In some examples, the multi-capacitor module including the stacked MIM capacitor structure may be constructed concurrently with an interconnect structure or other IC structure. In some examples, the stacked MIM capacitor structure may be constructed using a damascene process without added photomask layers, as compared with a background IC fabrication process. In addition, the first, second, and third electrodes may be contacted by respective first, second, and third electrode connection elements formed in an overlying metal layer (e.g., a metal interconnect layer) without added photomask layers.

In some examples, the stacked MIM capacitor structure may be constructed between two metal interconnect layers, e.g., two aluminum interconnect layers, at any depth in the relevant IC device structure. In other examples, the stacked MIM capacitor structure may be constructed between a silicided polysilicon layer and a first metal interconnect layer (metal-1), or between a shallow trench isolation (STI) oxide region and a first metal interconnect layer (metal-1).

One aspect provides a multi-capacitor module including a stacked MIM structure including a cup-shaped first electrode, a cup-shaped first insulator formed over the cup-shaped first electrode, a cup-shaped second electrode formed over the cup-shaped first insulator, a cup-shaped second insulator formed over the cup-shaped second electrode, a third electrode formed over the cup-shaped second insulator, a first sidewall spacer located between the cup-shaped first electrode and the cup-shaped second electrode, and a second sidewall spacer located between the cup-shaped second electrode and the third electrode. The cup-shaped first electrode, the cup-shaped second electrode, and the cup-shaped first insulator define a first capacitor, and the cup-shaped second electrode, the third electrode, and the cup-shaped second insulator define a second capacitor.

As used herein, a first element is located "between" two other elements (second and third elements) if the first element is located between at least a portion of the second element and at least a portion of the third element. For example, in some examples, the first sidewall spacer is located between a vertically-extending first electrode sidewall of the cup-shaped first electrode and a vertically-extending first insulator sidewall of the cup-shaped first insulator, and the second sidewall spacer is located between a vertically-extending second electrode sidewall of the cup-shaped second electrode and a vertically-extending second insulator sidewall of the cup-shaped second insulator.

In some examples, the cup-shaped first electrode includes a laterally-extending first electrode base and a vertically-extending first electrode sidewall extending upwardly from the laterally-extending first electrode base, the first cup-shaped insulator includes a laterally-extending first insulator base and a vertically-extending first insulator sidewall extending upwardly from the laterally-extending first insulator base, the cup-shaped second electrode includes a laterally-extending second electrode base and a vertically-extending second electrode sidewall extending upwardly from the laterally-extending second electrode base, the second cup-shaped insulator includes a laterally-extending second insulator base and a vertically-extending second insulator sidewall extending upwardly from the laterally-extending second insulator base, the first sidewall spacer is located between the vertically-extending first electrode sidewall and the vertically-extending first insulator sidewall, and the second sidewall spacer is located between the vertically-extending second electrode sidewall and the vertically-extending second insulator sidewall.

In some examples, the first capacitor comprises a first planar capacitor defined by the laterally-extending second electrode base, the laterally-extending first insulator base, and the laterally-extending first electrode base, and the second capacitor comprises a second planar capacitor defined by the third electrode, the laterally-extending second insulator base, and the laterally-extending second electrode base.

In some examples, the MIM capacitor module includes a first electrode connection element electrically connected to the vertically-extending first electrode sidewall, a second electrode connection element electrically connected to the vertically-extending second electrode sidewall, and a third electrode connection element electrically connected to the third electrode.

In some examples, the first electrode connection element, the second electrode connection element, and the third electrode connection element are formed in a common (i.e., same) metal layer.

In some examples, the MIM capacitor module includes a stacked MIM capacitor structure base formed in a lower metal layer, wherein the stacked MIM capacitor structure is formed on the stacked MIM capacitor structure base, and wherein the first electrode connection element, the second electrode connection element, and the third electrode connection element are formed in an upper metal layer.

In some examples, the lower metal layer and upper metal layer comprise respective metal interconnect layers.

In some examples, the lower metal layer comprises a silicided polysilicon layer, wherein the stacked MIM capacitor structure base comprises a metal silicide region formed on a polysilicon structure.

In some examples, the stacked MIM capacitor structure base is formed between a shallow trench isolation (STI) field oxide region and a metal interconnect layer.

In some examples, the first capacitor and the second capacitor are electrically connected in series by respective electrode connection elements.

In some examples, the first capacitor and the second capacitor are electrically connected in parallel by respective electrode connection elements.

Another aspect provides an integrated circuit (IC) device including an IC structure and a multi-capacitor module. The IC structure includes a lower IC element, an upper IC element, and a vertically-extending IC contact element formed in a dielectric region and conductively connected between the lower IC element and the upper IC element. The multi-capacitor module includes a stacked MIM structure formed in a tub opening in the dielectric region. The stacked MIM capacitor structure includes a cup-shaped first electrode, a cup-shaped first insulator formed over the cup-shaped first electrode, a cup-shaped second electrode formed over the cup-shaped first insulator, a cup-shaped second insulator formed over the cup-shaped second electrode, a third electrode formed over the cup-shaped second insulator, a first sidewall spacer located between the cup-shaped first electrode and the cup-shaped second electrode, and a second sidewall spacer located between the cup-shaped second electrode and the third electrode. The cup-shaped first electrode, the cup-shaped second electrode, and the cup-shaped first insulator define a first capacitor, and the cup-shaped second electrode, the third electrode, and the cup-shaped second insulator define a second capacitor. The multi-capacitor module also includes a third electrode connection element electrically connected to the third electrode, wherein the third electrode connection element and the upper IC element are formed in a common (i.e., same) metal layer.

In some examples, the multi-capacitor module includes a first electrode connection element electrically connected to the vertically-extending first electrode sidewall, and a second electrode connection element electrically connected to the vertically-extending second electrode sidewall, wherein the lower IC element is formed in a lower metal layer, and wherein the first electrode connection element, the second electrode connection element, and the third electrode connection element are formed in an upper metal layer.

In some examples, the stacked MIM capacitor structure is formed on a stacked MIM capacitor structure base, the stacked MIM capacitor structure base and the lower IC element are formed in a lower metal layer, and the third electrode connection element and the upper IC element are formed in an upper metal layer.

In some examples, the lower metal layer and the upper metal layer comprise respective metal interconnect layers.

In some examples, the lower metal layer comprises a silicided polysilicon layer, wherein the lower IC element and the stacked MIM capacitor structure base respectively comprise a respective metal silicide region formed on a respective polysilicon structure, and the upper metal layer comprises a metal interconnect layer.

In some examples, the stacked MIM capacitor structure is formed on a shallow trench isolation (STI) field oxide region.

In some examples, the vertically-extending IC contact element and the cup-shaped first electrode are formed from a common (i.e., same) conformal metal.

Another aspect provides a method including forming a tub opening in a dielectric region, depositing a first conformal metal in the tub opening, forming a first sidewall spacer structure, after forming the first sidewall spacer structure, depositing a first insulator layer over the first conformal metal and over the first sidewall spacer structure, depositing a second conformal metal over the first insulator layer, forming a second sidewall spacer, after forming the second sidewall spacer structure, depositing a second insulator layer over the second conformal metal and over the second sidewall spacer structure, depositing a third electrode metal over the second insulator layer, and performing a planarization process defining a stacked MIM structure in the tub opening.

In some examples, the deposited first conformal metal defines a cup-shaped first electrode structure including a laterally-extending first electrode base and a vertically-extending first electrode sidewall extending upwardly from the laterally-extending first electrode base, and forming the first sidewall spacer structure includes (a) depositing a first spacer layer forming a first spacer layer cup structure including a laterally-extending first spacer layer cup base and a vertically-extending first spacer layer cup sidewall extending upwardly from the laterally-extending first spacer layer cup base, and (b) performing an anisotropic etch removing the laterally-extending first spacer layer cup base and exposing an upper surface of the laterally-extending first electrode base.

In some examples, after the planarization process: a remaining portion of the first conformal metal defines a cup-shaped first electrode, a remaining portion of the first sidewall spacer structure defines a first sidewall spacer, a remaining portion of the first insulator layer defines a cup-shaped first insulator, a remaining portion of the second conformal metal defines a cup-shaped second electrode, a remaining portion of the second sidewall spacer structure defines a second sidewall spacer, a remaining portion of the second insulator layer defines a cup-shaped second insulator, and a remaining portion of the third electrode metal defines a third electrode in an opening defined by the cup-shaped second insulator.

In some examples, the method includes forming a metal layer including a first electrode connection element electrically connected to the cup-shaped first electrode, a second electrode connection element electrically connected to cup-shaped second electrode, and a third electrode connection element electrically connected to the third electrode.

Another aspect provides a multi-capacitor module including a first capacitor including a first cup-shaped insulator arranged between a first electrode and a second electrode, a second capacitor including a second cup-shaped insulator arranged between the second electrode and a third electrode, wherein the first cup-shaped insulator includes a laterally-extending first insulator base and a vertically-extending first insulator sidewall extending upwardly from the laterally-extending first insulator base, and a first dielectric sidewall spacer adjacent the first vertically-extending first insulator sidewall, the first dielectric sidewall spacer preventing or reducing a capacitive coupling between the first electrode and the second electrode through the first vertically-extending insulator sidewall.

BRIEF DESCRIPTION OF THE DRAWINGS

Example aspects of the present disclosure are described below in conjunction with the figures, in which.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

Figure 1A:
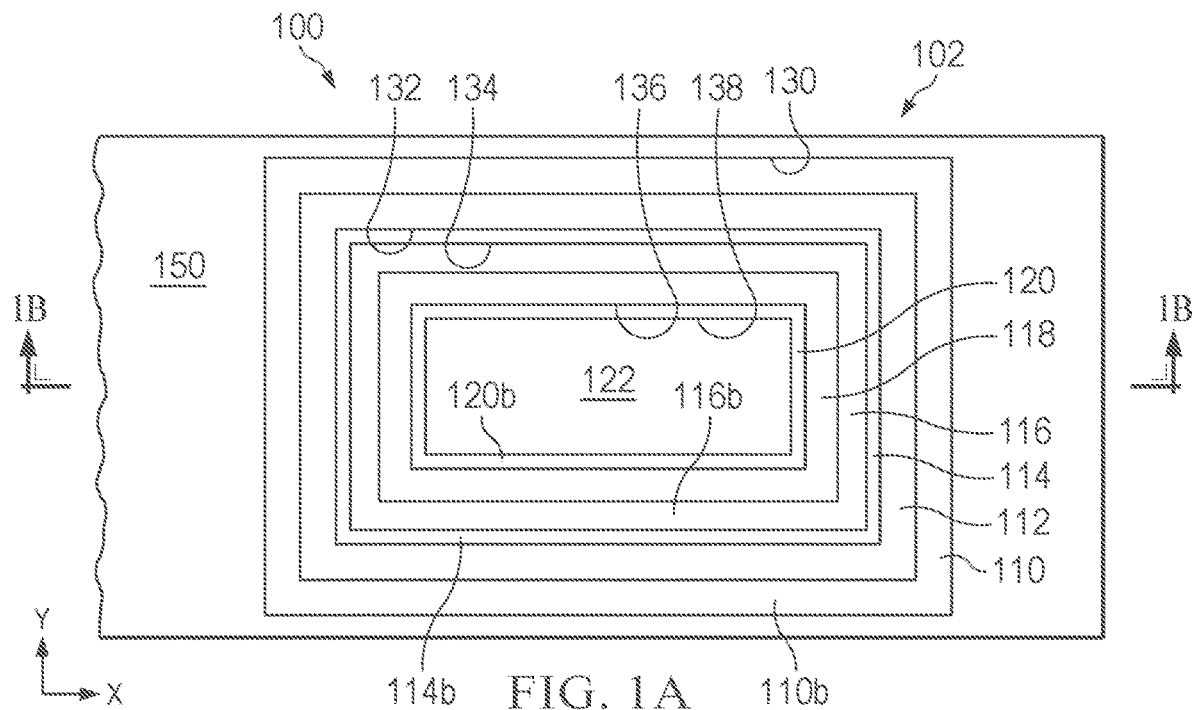
FIG. 1A is a top view and FIG. 1B is a cross-sectional side view of an example multi-capacitor module including a stacked metal-insulator-metal (MIM) structure.
Figure 1B:
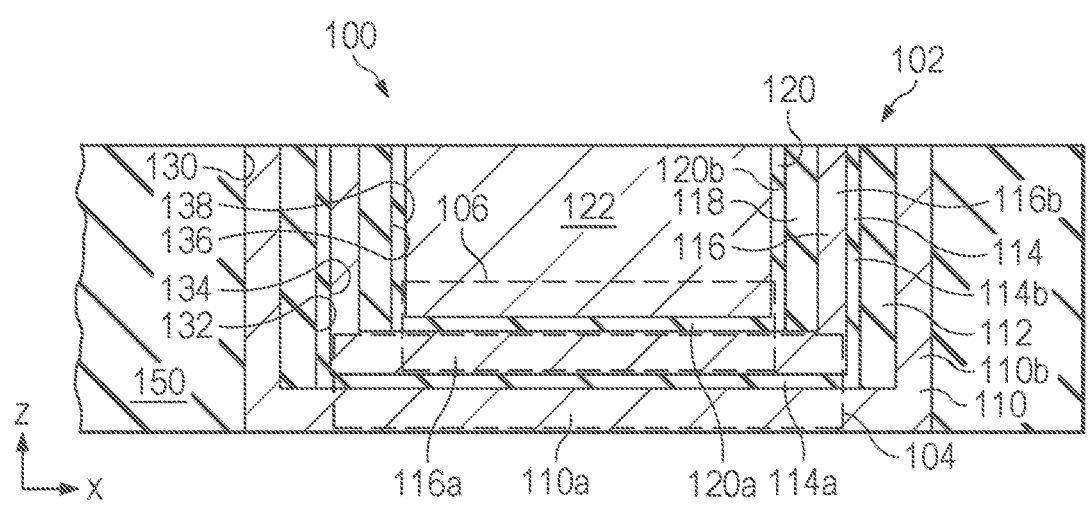

FIG. 1A is a top view and FIG. 1B is a cross-sectional side view (through line 1B-1B shown in FIG. 1A) of an example multi-capacitor module 100 including a stacked MIM capacitor structure 102, according to one example. In this example the stacked MIM capacitor structure 102 defines a first capacitor 104 and a second capacitor 106 physically arranged in a stacked manner. As discussed below, the first capacitor 104 and second capacitor 106 may be electrically connected in series or in parallel, depending on the particular example. Thus, the example multi-capacitor module 100 is a two-capacitor module (or dual-capacitor module). In other examples multi-capacitor module 100 may include three, four, or more capacitors physically arranged in a stacked manner.

As shown in FIGS. 1A and 1B, the example stacked MIM capacitor structure 102 includes a cup-shaped first electrode 110, a cup-shaped first insulator 114 formed in the cup-shaped first electrode 110, a cup-shaped second electrode 116 formed in the cup-shaped first insulator 114, a cup-shaped second insulator 120 formed in the cup-shaped second electrode 116, and a third electrode 122 formed in the cup-shaped second insulator 120. The cup-shaped first electrode 110, the cup-shaped second electrode 116, and the cup-shaped first insulator 114 define a first capacitor 104, and the cup-shaped second electrode 116, the third electrode 122, and the cup-shaped second insulator 120 define a second capacitor 106.

The cup-shaped first electrode 110 includes a laterally-extending first electrode base 110a and a vertically-extending first electrode sidewall 110b extending upwardly from the laterally-extending first electrode base 110a. As shown in FIG. 1A, in a horizontal plane (x-y plane) the vertically-extending first electrode sidewall 110b may have a closed-loop rectangular perimeter and may extend upwardly from a perimeter of laterally-extending first electrode base 110a.

The first cup-shaped insulator 114 includes a laterally-extending first insulator base 114a and a vertically-extending first insulator sidewall 114b extending upwardly from the laterally-extending first insulator base 114a. As shown in FIG. 1A, in a horizontal plane (x-y plane) the vertically-extending first insulator sidewall 114b may have a closed-loop rectangular perimeter and may extend upwardly from a perimeter of laterally-extending first insulator base 114a.

The cup-shaped second electrode 116 includes a laterally-extending second electrode base 116a and a vertically-extending second electrode sidewall 116b extending upwardly from the laterally-extending second electrode base 116a. As shown in FIG. 1A, in a horizontal plane (x-y plane) the vertically-extending second electrode sidewall 116b may have a closed-loop rectangular perimeter and may extend upwardly from a perimeter of laterally-extending second electrode base 116a.

The second cup-shaped insulator 120 includes a laterally-extending second insulator base 120a and a vertically-extending second insulator sidewall 120b extending upwardly from the laterally-extending second insulator base 120a. As shown in FIG. 1A, in a horizontal plane (x-y plane) the vertically-extending second insulator sidewall 120b may have a closed-loop rectangular perimeter and may extend upwardly from a perimeter of laterally-extending second insulator base 120a.

As used herein, a "cup-shaped" structure (e.g., cup-shaped first electrode 110, cup-shaped first insulator 114, cup-shaped second electrode 116, or cup-shaped second insulator 120) refers to a structure including a laterally-extending base and a sidewall extending upwardly from the laterally-extending base, for example a sidewall extending upwardly from one or more perimeter edges of the laterally-extending base. For example, a cup-shaped structure may include a sidewall extending upwardly from all perimeter edges of the respective laterally-extending base, such that the sidewall defines a closed-loop perimeter in a lateral plane. As another example, a cup-shaped structure may include a sidewall extending upwardly from one perimeter edge or two opposing perimeter edges of the respective laterally-extending base. While the various closed-loop perimeters in a lateral plane are shown as rectangular, this is not meant to be limiting in any way. In one example one or more of the various closed-loop perimeters may be circular or oval shape from a top view.

As shown in FIGS. 1A and 1B, the example stacked MIM capacitor structure 102 also includes (a) a first sidewall spacer 112 located between the cup-shaped first electrode 110 and the cup-shaped first insulator 114, and (b) a second sidewall spacer 118 located between the formed cup-shaped second electrode 116 and the cup-shaped second insulator 120. In some examples the first sidewall spacer 112 is located between (a) the vertically-extending first electrode sidewall 110b and the vertically-extending second electrode sidewall 116b, and (b) the second sidewall spacer 118 located between the vertically-extending second electrode sidewall 116b and the third electrode 122. For example, in the example shown in of FIGS. 1A and 1B (as well as the examples shown in FIGS. 2A-8), the first sidewall spacer 112 is particularly formed between the vertically-extending first electrode sidewall 110b and the vertically-extending first insulator sidewall 114b, and the second sidewall spacer 118 is particularly formed between the vertically-extending second electrode sidewall 116b and the vertically-extending second insulator sidewall 120b.

In other examples, the first sidewall spacer 112 is particularly formed between the vertically-extending second electrode sidewall 116b and the vertically-extending first insulator sidewall 114b, and the second sidewall spacer 118 is particularly formed between the third electrode 122 and the vertically-extending second insulator sidewall 120b, e.g., as discussed below after the discussion of the example method shown in FIGS. 6A-6N.

In the illustrated example, the cup-shaped first electrode 110 is formed in a tub opening 130 formed in a dielectric region 150. The first sidewall spacer 112 is formed on a radially interior surface of the vertically-extending first electrode sidewall 110b. The cup-shaped first insulator 114 is formed in an opening 132 defined by a radially interior surface of the first sidewall spacer 112 and the laterally-extending first electrode base 110a. The cup-shaped second electrode 116 is formed in an opening 134 defined by the cup-shaped first insulator 114. The second sidewall spacer 118 is formed on a radially interior surface of the vertically-extending second electrode sidewall 116b. The cup-shaped second insulator 120 is formed in an opening 136 defined by a radially interior surface of the second sidewall spacer 118 and the laterally-extending second electrode base 116a. The third electrode 122 is formed in an opening 138 defined by the cup-shaped second insulator 120.

The first sidewall spacer 112 may inhibit a capacitive coupling between the vertically-extending first electrode sidewall 110b and the vertically-extending second electrode sidewall 116b across the vertically-extending first insulator sidewall 114b of the cup-shaped first insulator 114. The second sidewall spacer 118 may inhibit a capacitive coupling between the vertically-extending second electrode sidewall 116b and the third electrode 122 across the vertically-extending second insulator sidewall 120b of the cup-shaped second insulator 120.

As used herein, a sidewall spacer inhibiting capacitive coupling between two electrode structures means the sidewall spacer reduces a capacitive coupling between the two electrode structures by at least 80%, and in some examples by at least 90%, as compared with a similar device formed without the sidewall spacer. For example, the first sidewall spacer 112 may reduce a capacitive coupling between the vertically-extending first electrode sidewall 110b and the vertically-extending second electrode sidewall 116b by at least 80% and in some examples by at least 90%, as compared with a stacked MIM capacitor structure 102 formed without the first sidewall spacer 112. Similarly, the second sidewall spacer 118 may reduce a capacitive coupling between the vertically-extending second electrode sidewall 116b and the third electrode 122 by at least 80% and in some examples by at least 90%, as compared with a stacked MIM capacitor structure 102 formed without the second sidewall spacer 118.

As a result of the first sidewall spacer 112 inhibiting capacitive coupling across the vertically-extending first insulator sidewall 114b, capacitive coupling between the cup-shaped first electrode 110 and the cup-shaped second electrode 116 occurs predominantly through the laterally-extending first insulator base 114a, thereby effective defining the first capacitor 104 as a planar capacitor, as represented by the dashed line 104. Similarly, as a result of the second sidewall spacer 118 inhibiting capacitive coupling across the vertically-extending second insulator sidewall 120b, capacitive coupling between the cup-shaped second electrode 116 and the third electrode 122 occurs predominantly through the laterally-extending second insulator base 120a, thereby effective defining the second capacitor 106 as a planar capacitor, as represented by the dashed line 106. As shown, the first capacitor 104 and second capacitor 106 are arranged in a stacked manner, with the second capacitor 106 stacked on the first capacitor 104.

As noted above, the first capacitor 104 and second capacitor 106 may be electrically connected in series or in parallel, depending on the particular example. For example, as discussed below with reference to FIGS. 3A-3B and FIGS. 4A-4B, the first capacitor 104 and second capacitor 106 may be electrically connected in series by a first arrangement of electrode connection elements (FIGS. 3A-3B), or alternatively may be electrically connected in parallel by a second arrangement of electrode connection elements (FIGS. 4A-4B).

Figure 2A:
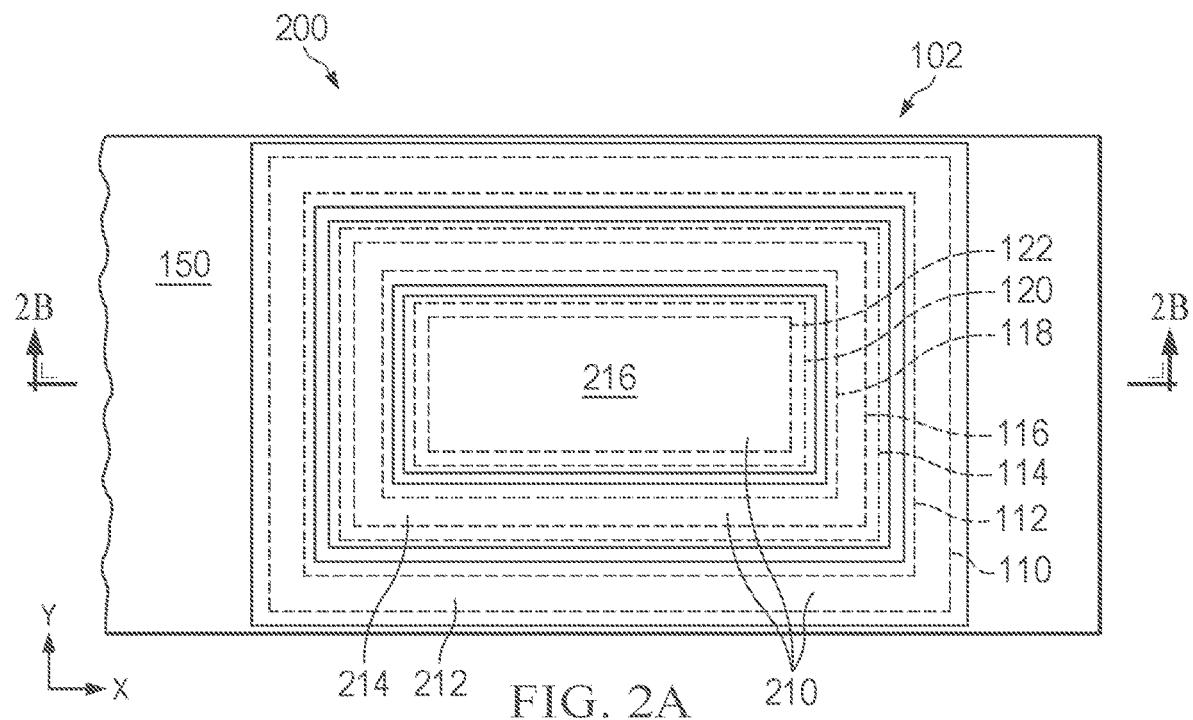
FIG. 2A is a top view and FIG. 2B is a cross-sectional side view of an example multi-capacitor module including a stacked MIM capacitor structure and associated contact structures, according to one example.
Figure 2B:
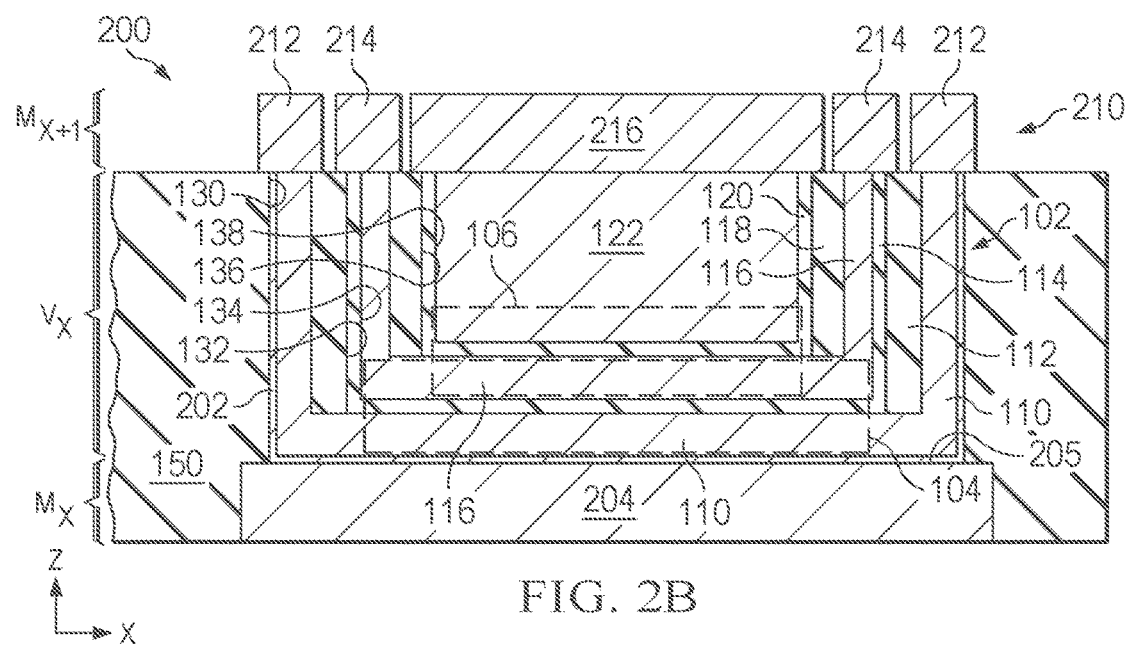

FIG. 2A is a top view and FIG. 2B is a cross-sectional side view (through line 2B-2B shown in FIG. 2A) of an example multi-capacitor module 200 including the stacked MIM capacitor structure 102 shown in FIGS. 1A and 1B, according to one example. As discussed above, the example stacked MIM capacitor structure 102 includes the cup-shaped first electrode 110, the first sidewall spacer 112, the cup-shaped first insulator 114, the cup-shaped second electrode 116, the second sidewall spacer 118, the cup-shaped second insulator 120, and the third electrode 122. The cup-shaped first electrode 110, the cup-shaped second electrode 116, and the cup-shaped first insulator 114 define the first capacitor 104; and the cup-shaped second electrode 116, the third electrode 122, and the cup-shaped second insulator 120 define the second capacitor 106. In some examples, the cup-shaped first electrode 110 is formed over a liner (or "glue layer") 202, e.g., comprising TiN with a thickness in the range of 50 Å-200 Å.

The example multi-capacitor module 200 includes a stacked MIM capacitor structure base 204 formed in a lower metal layer $M_x$. The stacked MIM capacitor structure 102 may be formed over the stacked MIM capacitor structure base 204 and electrically connected to the stacked MIM capacitor structure base 204, in particular electrically connected to the cup-shaped first electrode 110 of the stacked MIM capacitor structure base 204. For example, as discussed below with reference to FIG. 6C, the liner 202 may be deposited in the tub opening 130 and directly on an upper surface 205 of the stacked MIM capacitor structure base 204, followed by deposition of a first conformal metal forming the cup-shaped first electrode 110.

Figure 7:
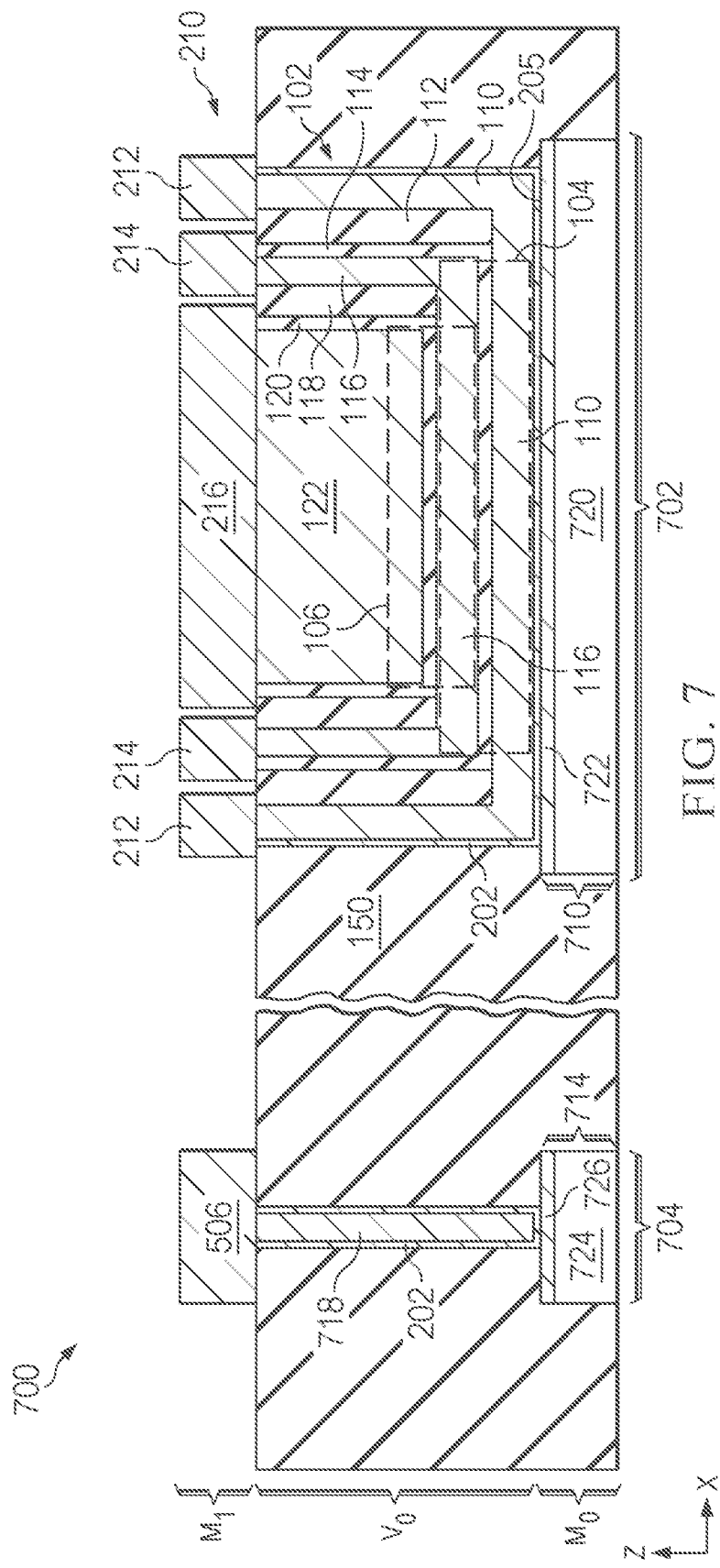
FIG. 7 is a cross-sectional side view of an IC device including an example multi-capacitor module including a stacked MIM capacitor structure, and an example interconnect structure, formed between a silicided polysilicon layer and a first metal interconnect layer.
Figure 8:
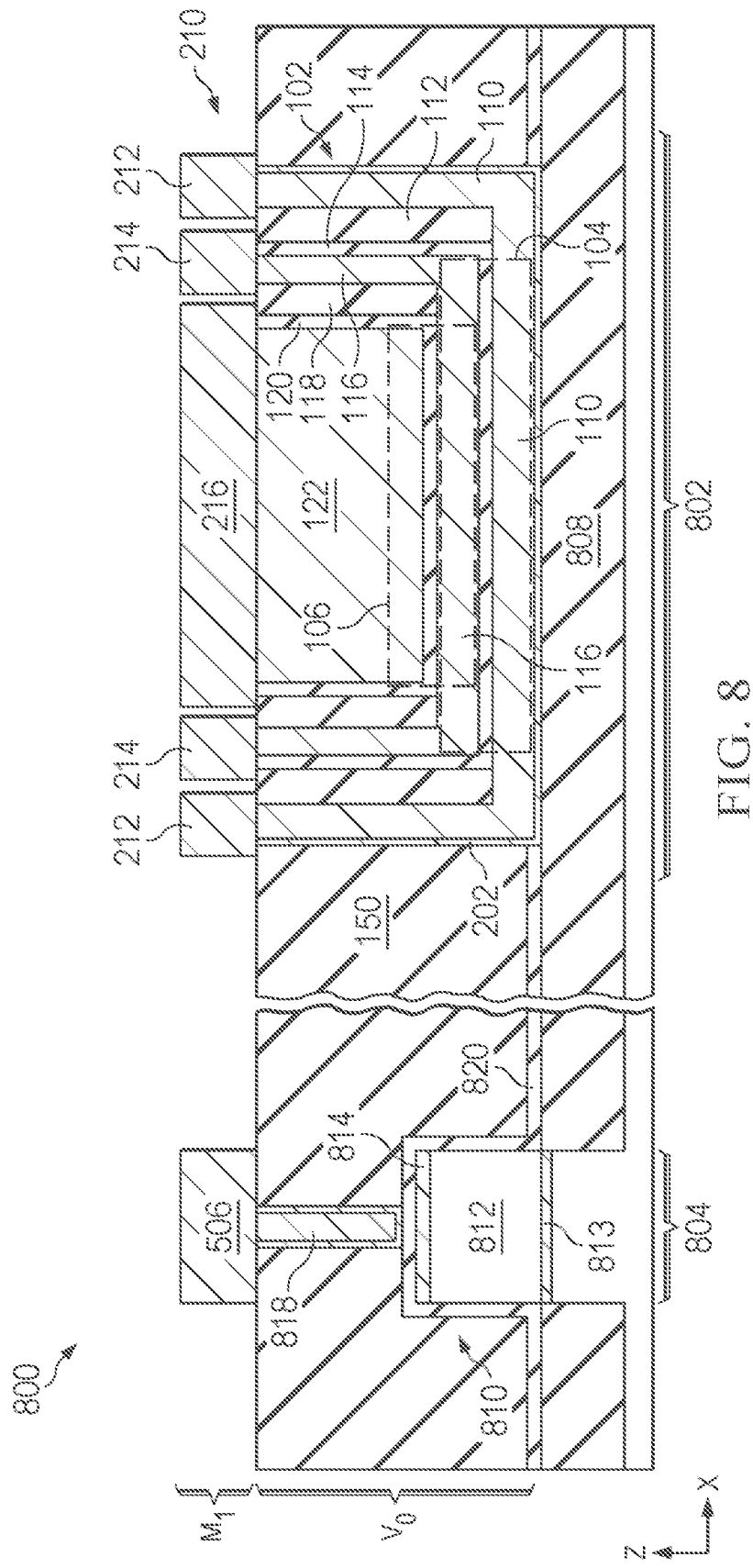
FIG. 8 is a cross-sectional side view of an IC device including an example multi-capacitor module including a stacked MIM capacitor structure, and an example IC structure, formed between a shallow trench isolation (STI) oxide region and a first metal interconnect layer.

In the illustrated example, the stacked MIM capacitor structure base 204 comprises a metal element (e.g., aluminum element) formed in a metal interconnect layer. In other examples, e.g., as shown in FIG. 7, the lower metal layer $M_x$ may comprise a silicided polysilicon layer formed below a first metal interconnect layer ("metal-1" layer), wherein the stacked MIM capacitor structure base 204 comprises a silicided polysilicon structure including a polysilicon region having a metal silicide layer region (e.g., comprising titanium silicide, cobalt silicide, or nickel silicide) formed thereon. In still other examples, e.g., as shown in FIG. 8 discussed below, the stacked MIM capacitor structure 102 may be formed directly on a shallow trench isolation (STI) oxide layer, e.g., omitting the stacked MIM capacitor structure base 204.

As shown in FIGS. 2A and 2B, the example multi-capacitor module 200 also includes a number of electrode connection elements 210 formed in an upper metal layer $M_{x+1}$. In this example, the electrode connection elements 210 include (a) a first electrode connection element 212 electrically connected to the cup-shaped first electrode 110, (b) a second electrode connection element 214 electrically connected to the cup-shaped second electrode 116, and (c) a third electrode connection element 216 electrically connected to the third electrode 122.

The electrode connection elements 210 may cover the top surfaces of respective components of the stacked MIM capacitor structure 102, for example to protect the respective components during a metal etch forming the electrode connection elements 210 and/or to effectively seal the respective top surfaces of the respective components (e.g., to prevent or reduce chemical attach or plasma etching of the respective components). For example, the first electrode connection element 212 may cover a top surface of the cup-shaped first electrode 110, particularly the top surface of the vertically-extending first electrode sidewall 110b, the second electrode connection element 214 may cover respective top surfaces of the cup-shaped first insulator 114 and the cup-shaped second electrode 116, particularly the top surface of vertically-extending first insulator sidewall 114b and the top surface of vertically-extending second electrode sidewall 116b, respectively, and the third electrode connection element 216 may cover respective top surfaces of the cup-shaped second insulator 120, particularly the top surface of vertically-extending second insulator sidewall 120b, and the third electrode 122. First electrode connection element 212 may form a respective closed loop perimeter, second electrode connection element 214 may form a respective closed loop perimeter within the closed loop perimeter of the first electrode connection element 212, and third electrode connection element 216 may be enclosed by the closed loop perimeter of the second electrode connection element 214.

Figure 3A:
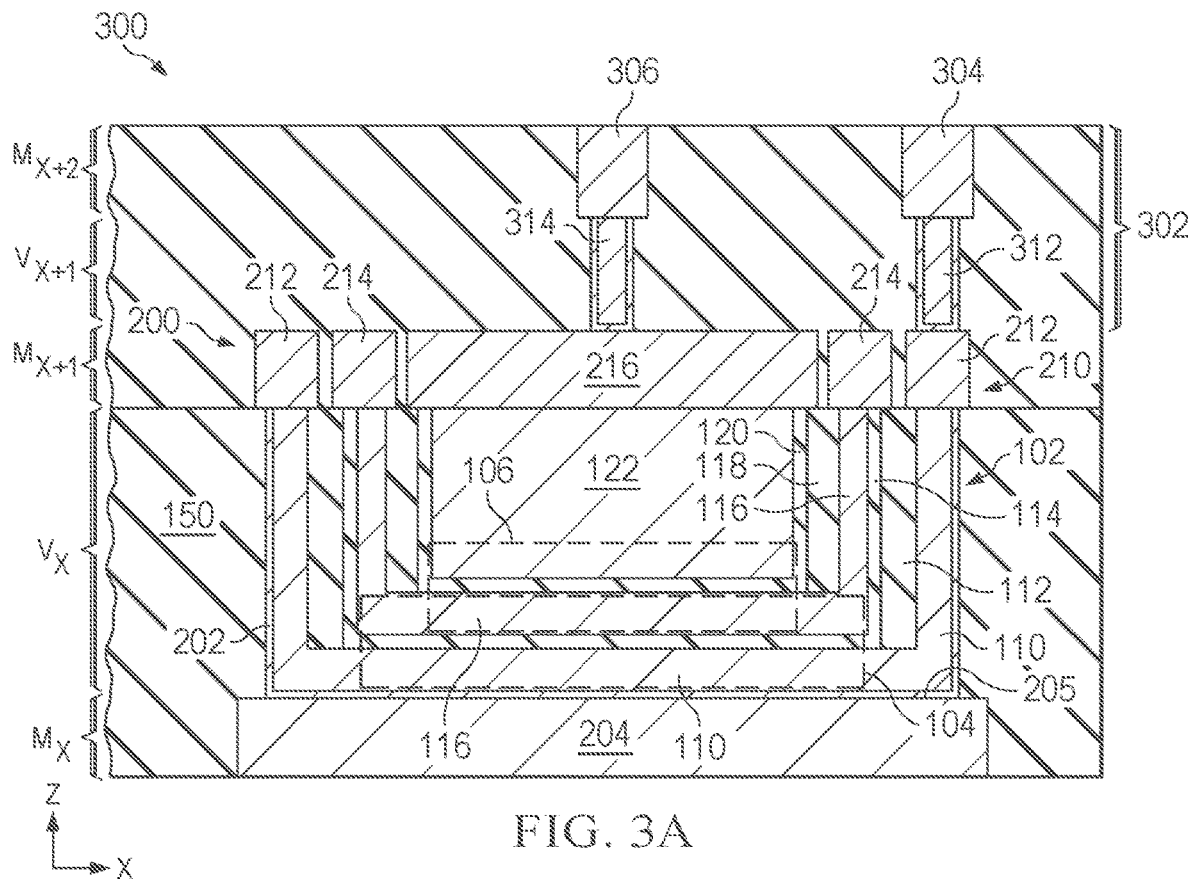
FIG. 3A is a cross-sectional side view of an example multi-capacitor module including two capacitors connected electrically in series.
Figure 3B:
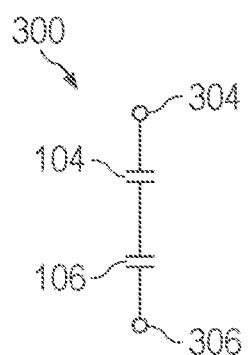
FIG. 3B is an electrical schematic of the example multi-capacitor module of FIG. 3A.
Figure 4A:
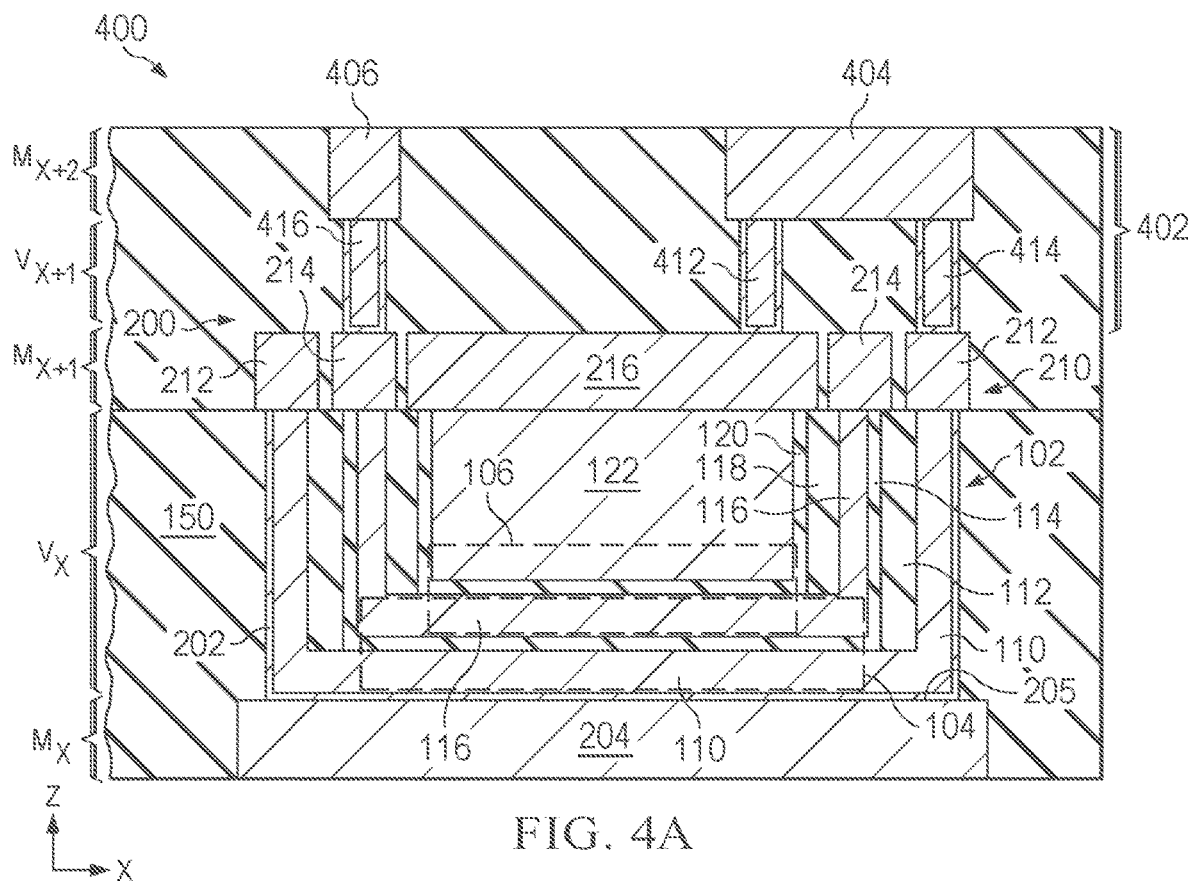
FIG. 4A is a cross-sectional side view of an example multi-capacitor module including two capacitors connected electrically in parallel.
Figure 4B:
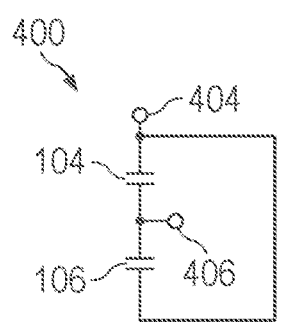
FIG. 4B is an electrical schematic of the example multi-capacitor module of FIG. 4A.

FIG. 3A is a cross-sectional side view of an example multi-capacitor device 300 including the first capacitor 104 and second capacitor 106 connected electrically in series. FIG. 3B is an electrical schematic of the example multi-capacitor device 300 shown in FIG. 3A. As shown in FIG. 3A, the example multi-capacitor module 300 includes the example multi-capacitor module 200 shown in FIGS. 2A-2B and an example arrangement of electrode connection elements 302 that connects the first capacitor 104 and second capacitor 106 electrically in series. The example arrangement of electrode connection elements 302 includes (a) a first multi-capacitor device terminal 304 electrically connected to the first electrode connection element 212 (and thus electrically connected to the cup-shaped first electrode 110) by a first terminal contact 312 and (b) a second multi-capacitor device terminal 306 electrically connected to the third electrode connection element 216 (and thus electrically connected to the third electrode 122) by a second terminal contact 314. Connections of circuitry to first multi-capacitor device terminal 304 and to second multi-capacitor device terminal 306 thus experience first and second capacitors 104, 106 in series.

In the illustrated example, the first multi-capacitor device terminal 304 and second multi-capacitor device terminal 306 comprise metal elements (e.g., aluminum elements) formed in an overlying metal layer $M_{x+2}$, and the first terminal contact 312 and second terminal contact 314 comprise metal elements (e.g., tungsten elements) formed in an overlying via layer $V_{x+1}$, using any suitable processes.

FIG. 4A is a cross-sectional side view of an example multi-capacitor device 400 including the first capacitor 104 and second capacitor 106 connected electrically in parallel. FIG. 4B is an electrical schematic of the example multi-capacitor device 400 shown in FIG. 4A. As shown in FIG. 4A, the example multi-capacitor module 400 includes the example multi-capacitor module 200 shown in FIGS. 2A-2B and an example arrangement of electrode connection elements 402 that connects the first capacitor 104 and second capacitor 106 electrically in parallel. The example arrangement of electrode connection elements 402 includes (a) a first multi-capacitor device terminal 404 electrically connected to both (i) the first electrode connection element 212 (and thus electrically connected to the cup-shaped first electrode 110) by a first terminal contact 412 and (ii) the third electrode connection element 216 (and thus electrically connected to the third electrode 122) by a second terminal contact 414, and (b) a second multi-capacitor device terminal 406 electrically connected to the second electrode connection element 214 (and thus electrically connected to the cup-shaped second electrode 116) by a third terminal contact 416. Connections of circuitry to first multi-capacitor device terminal 404 and to second multi-capacitor device terminal 406 thus experience first and second capacitors 104, 106 in parallel.

In the illustrated example, the first multi-capacitor device terminal 404 and second multi-capacitor device terminal 406 comprise metal elements (e.g., aluminum elements) formed in an overlying metal layer $M_{x+2}$, and the first terminal contact 412, second terminal contact 414, and third terminal contact 416 comprise metal elements (e.g., tungsten elements) formed in an overlying via layer $V_{x+1}$, using any suitable processes.

Figure 5:
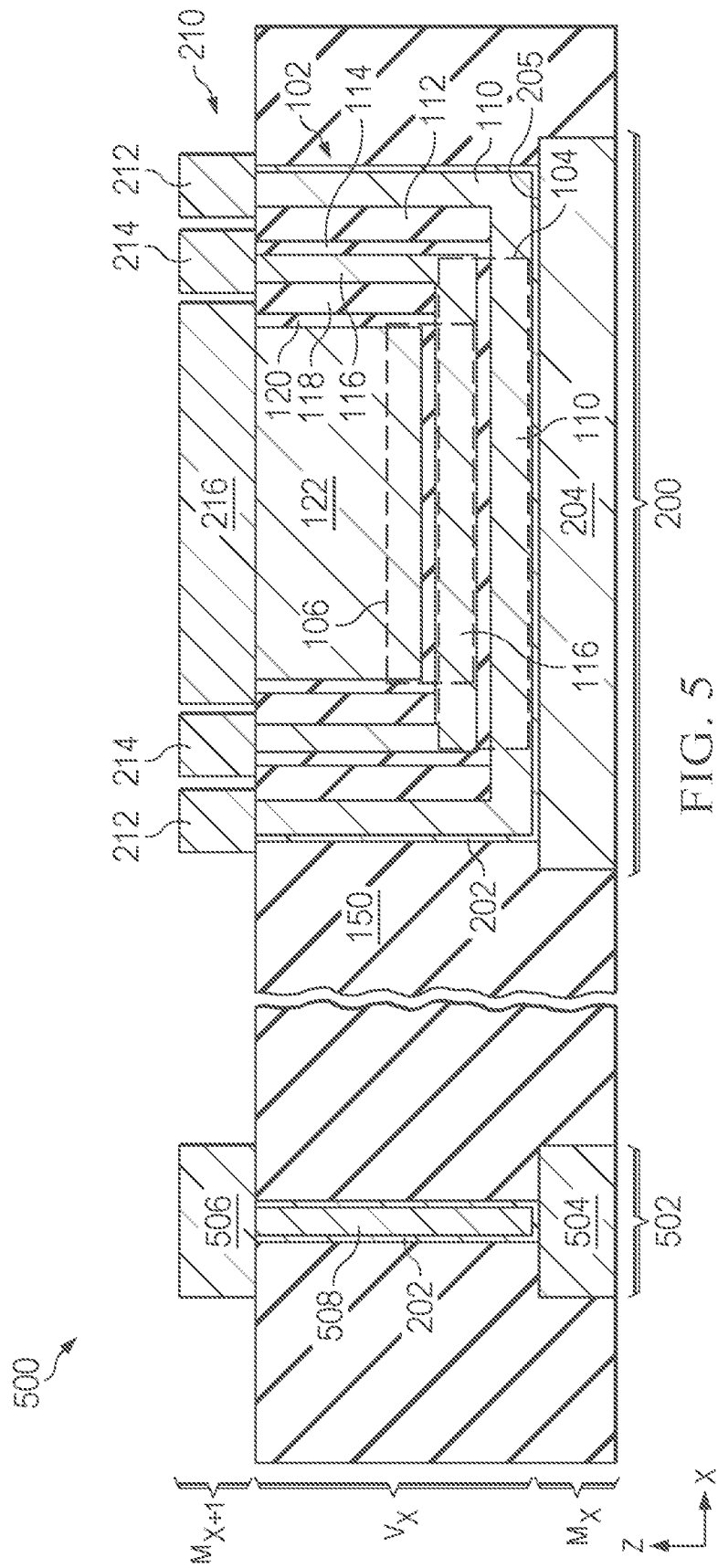
FIG. 5 is a cross-sectional side view of an example IC device including the multi-capacitor module of FIGS. 2A and 2B and a separate IC structure, which may be formed concurrently, according to one example.

FIG. 5 is a cross-sectional side view of an IC device 500 including the example multi-capacitor module 200 of FIGS. 2A-2B formed concurrently with an example IC structure 502. In some examples, the example multi-capacitor module 200 may be constructed without adding any photomask operations to the background integrated circuit fabrication process (e.g., the background integrated circuit fabrication process for forming the IC structure 502 and/or other IC elements).

As discussed above, the example multi-capacitor module 200 includes (a) the stacked MIM capacitor structure 102, (b) the stacked MIM capacitor structure base 204 formed in lower metal layer $M_x$, and (c) the first electrode connection element 212, second electrode connection element 214, and third electrode connection element 216 formed in upper metal layer $M_{x+1}$. As discussed above, the stacked MIM capacitor structure 102 includes the cup-shaped first electrode 110, the first sidewall spacer 112, the cup-shaped first insulator 114, the cup-shaped second electrode 116, the second sidewall spacer 118, the cup-shaped second insulator 120, and the third electrode 122. The cup-shaped first electrode 110, the cup-shaped second electrode 116, and the cup-shaped first insulator 114 define the first capacitor 104, and the cup-shaped second electrode 116, the third electrode 122, and the cup-shaped second insulator 120 define the second capacitor 106.

The example IC structure 502 may comprise a lower IC element 504 formed in the lower metal layer $M_x$, an upper IC element 506 formed in the upper metal layer $M_{x+1}$, and at least one vertically-extending IC contact element 508 formed in dielectric region 150 and conductively connected between the lower IC element 504 and the upper IC element 506. IC contact element 508 may be formed over liner 202 (e.g., TiN liner). In the illustrated example, the lower metal layer $M_x$ and upper metal layer $M_{x+1}$ comprise respective metal interconnect layers. Thus, the lower IC element 504 and upper IC element 506 may comprise metal interconnect elements formed in the lower metal layer $M_x$ and upper metal layer $M_{x+1}$, and vertically-extending IC contact element 508 may comprise an interconnect via formed in via layer $V_x$.

The lower IC element 504 and stacked MIM capacitor structure base 204 may be formed concurrently in lower metal layer $M_x$, e.g., as discussed below with reference to FIG. 6A. The upper IC element 506, first electrode connection element 212, second electrode connection element 214, and third electrode connection element 216 may be formed concurrently in upper metal layer $M_{x+1}$, e.g., as discussed below with reference to FIG. 6N. The vertically-extending IC contact element 508 (e.g., interconnect via) and cup-shaped first electrode 110 may be formed concurrently in via layer $V_x$, e.g., using a damascene process as discussed below with respect to FIGS. 6A-6C.

Figure 6A:
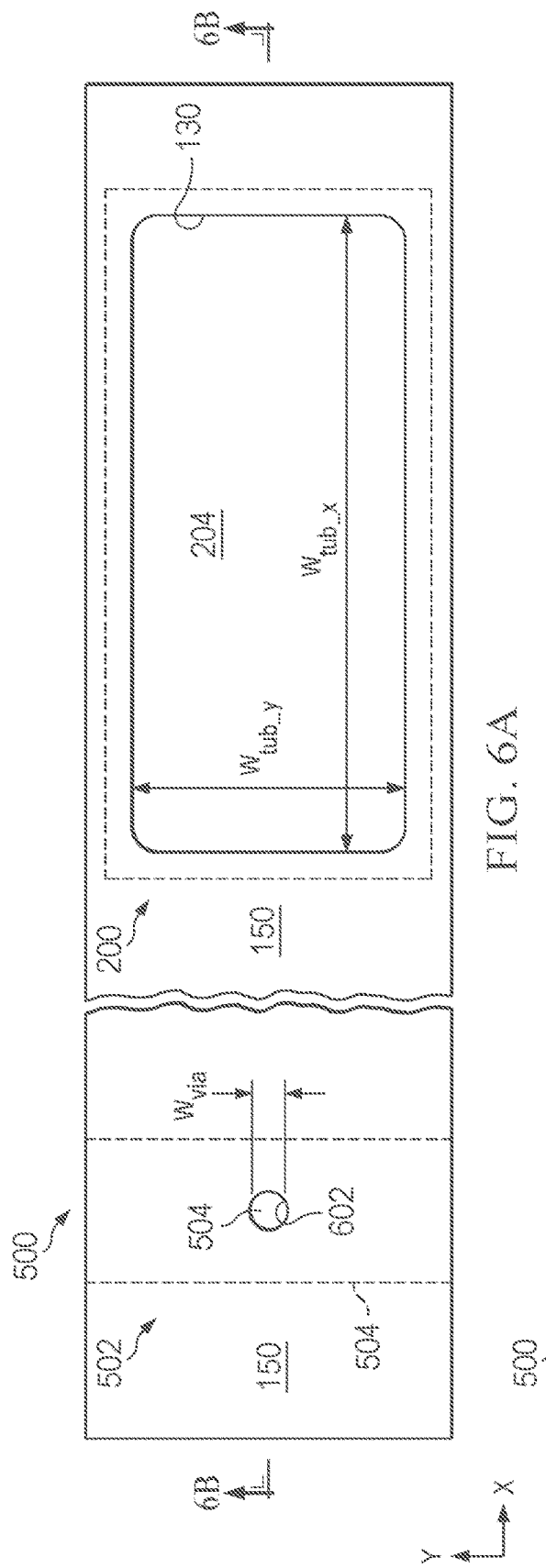
FIGS. 6A-6N show an example method of forming the example IC device shown in FIG. 5, including the example multi-capacitor module and the separate IC structure.
Figure 6B:
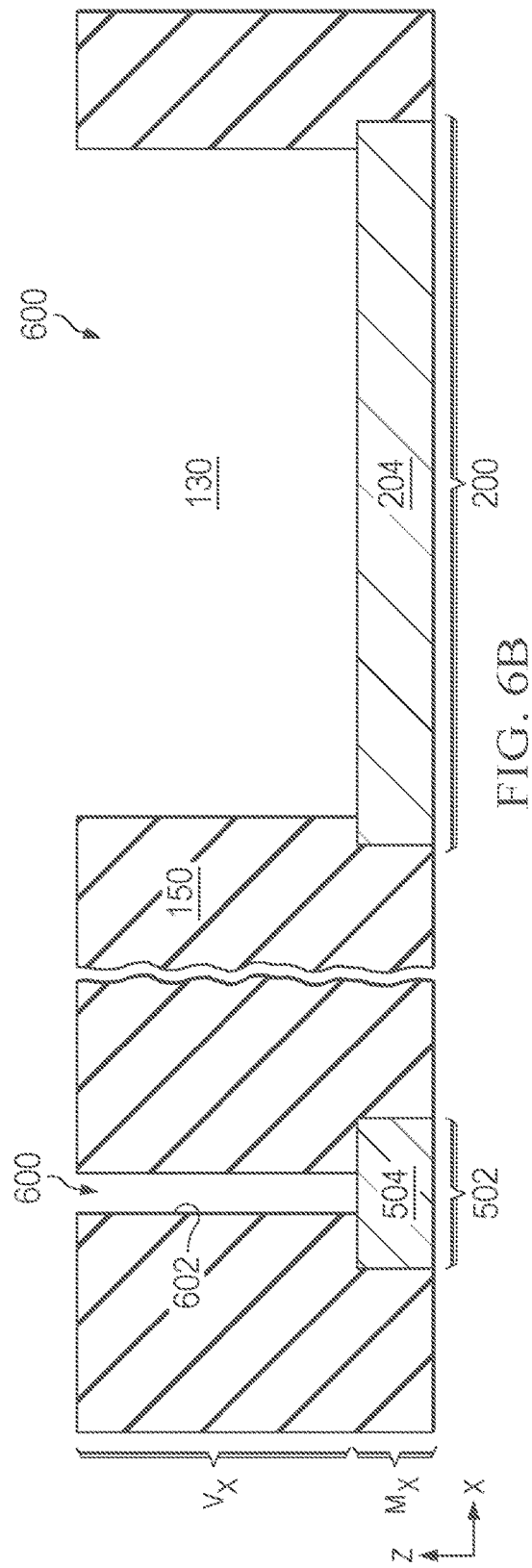
Figure 6C:
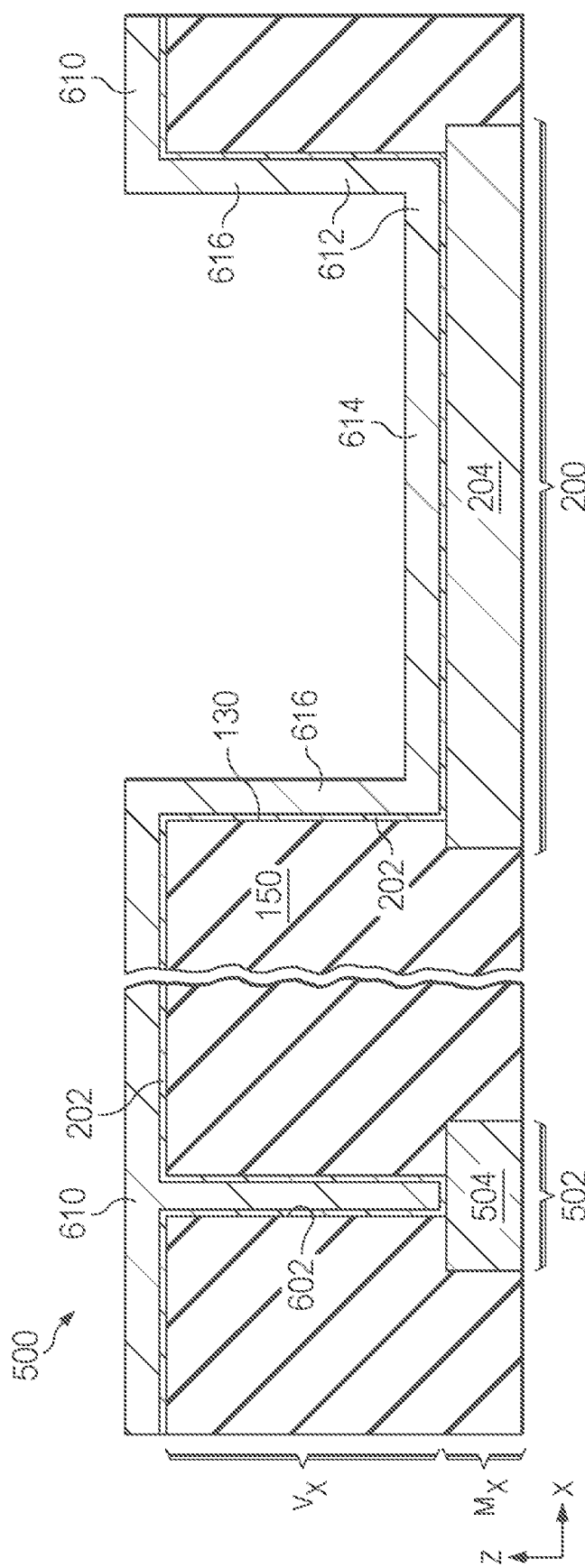
Figure 6D:
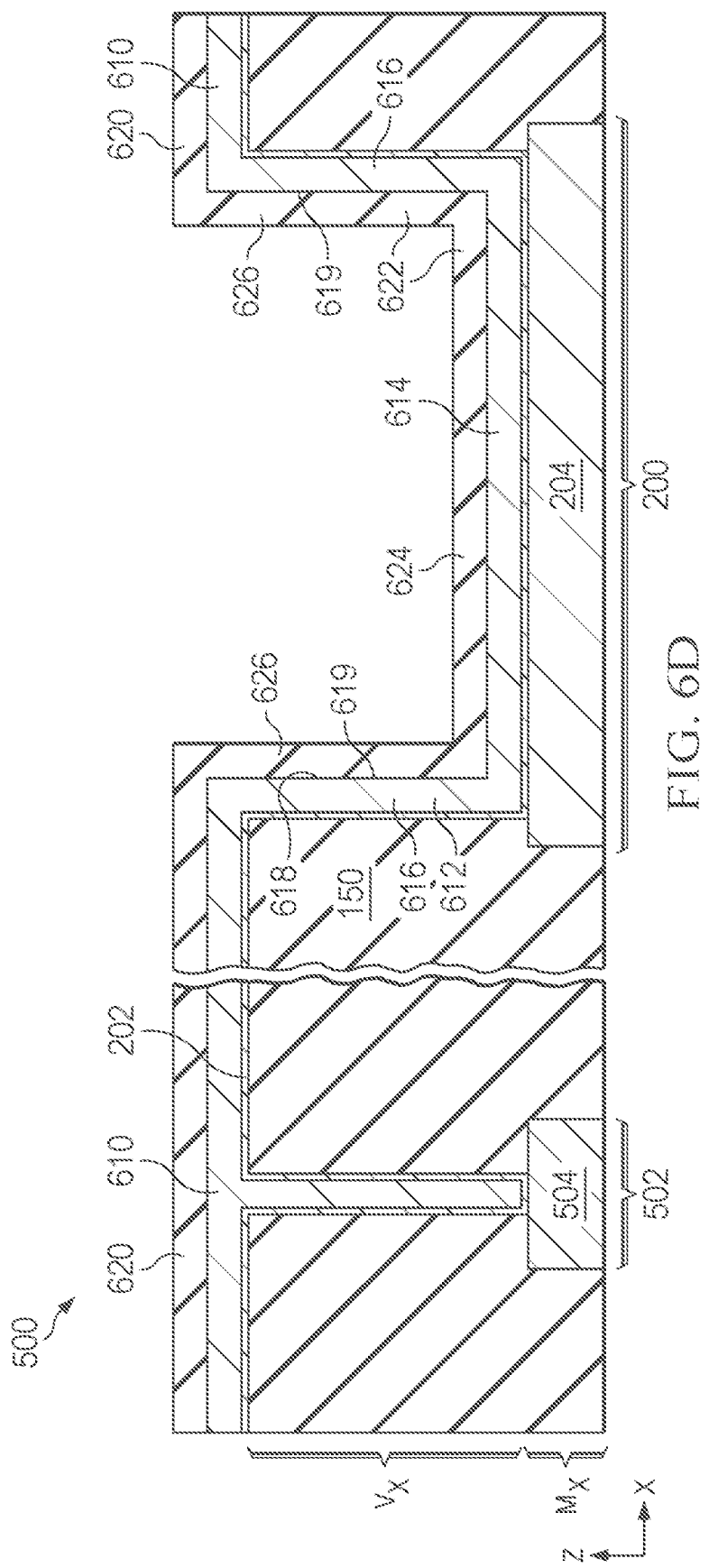
Figure 6E:
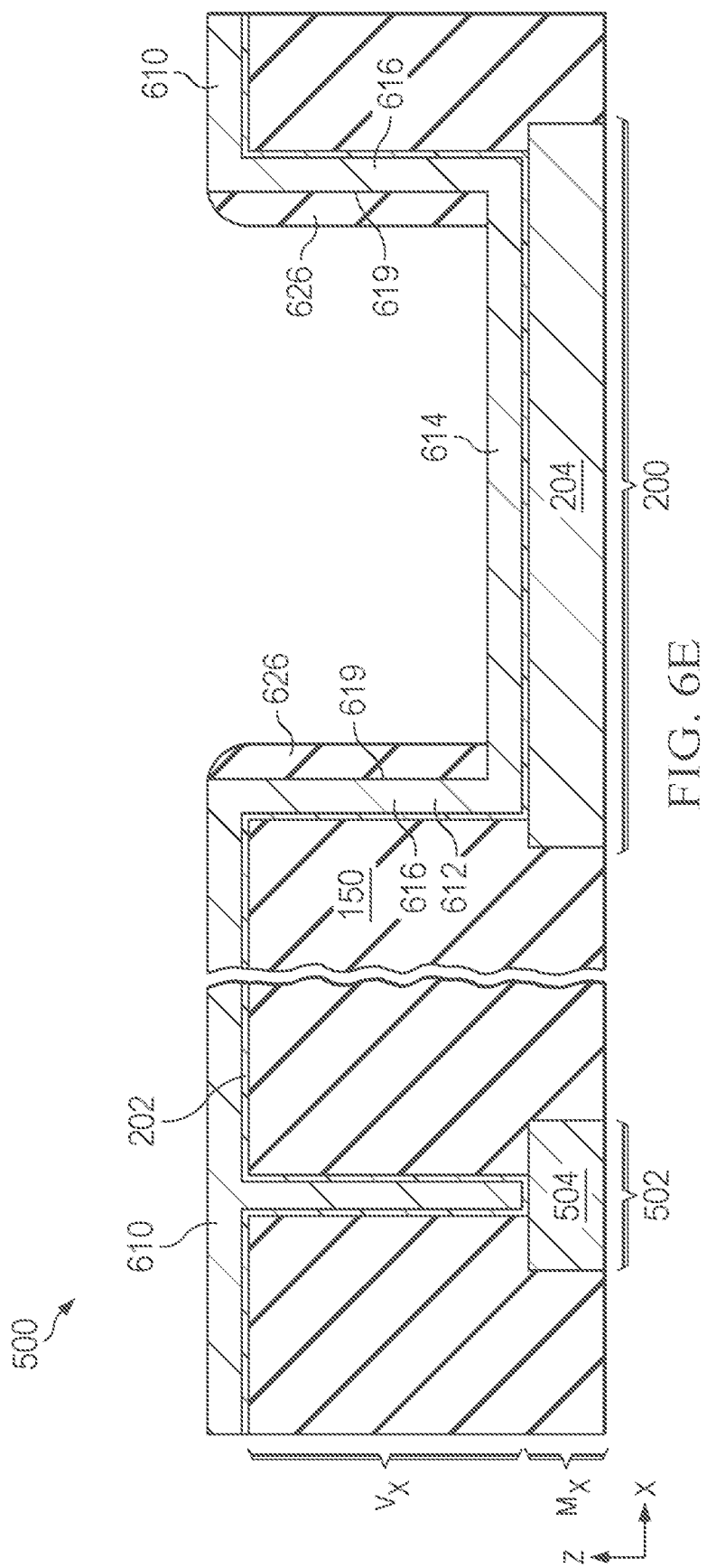
Figure 6F:
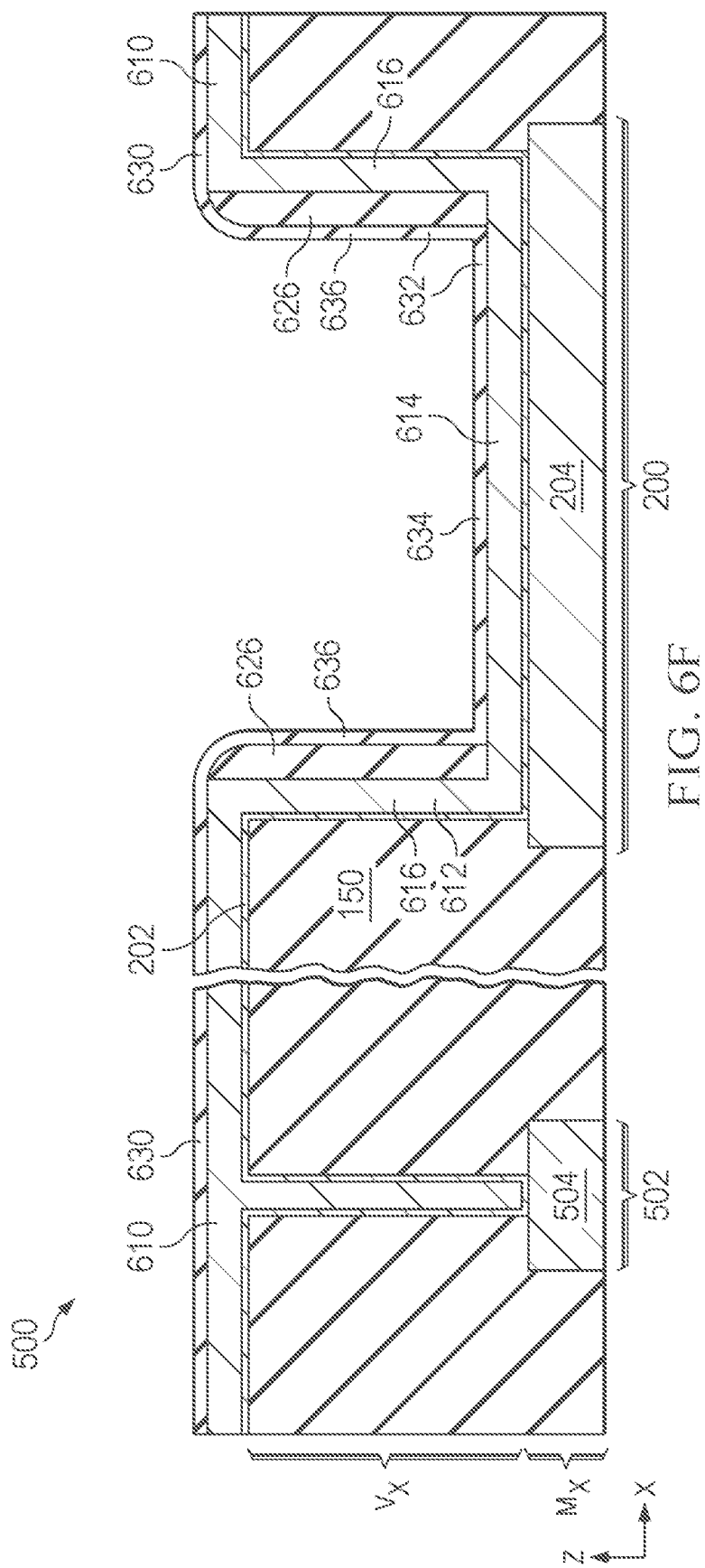
Figure 6G:
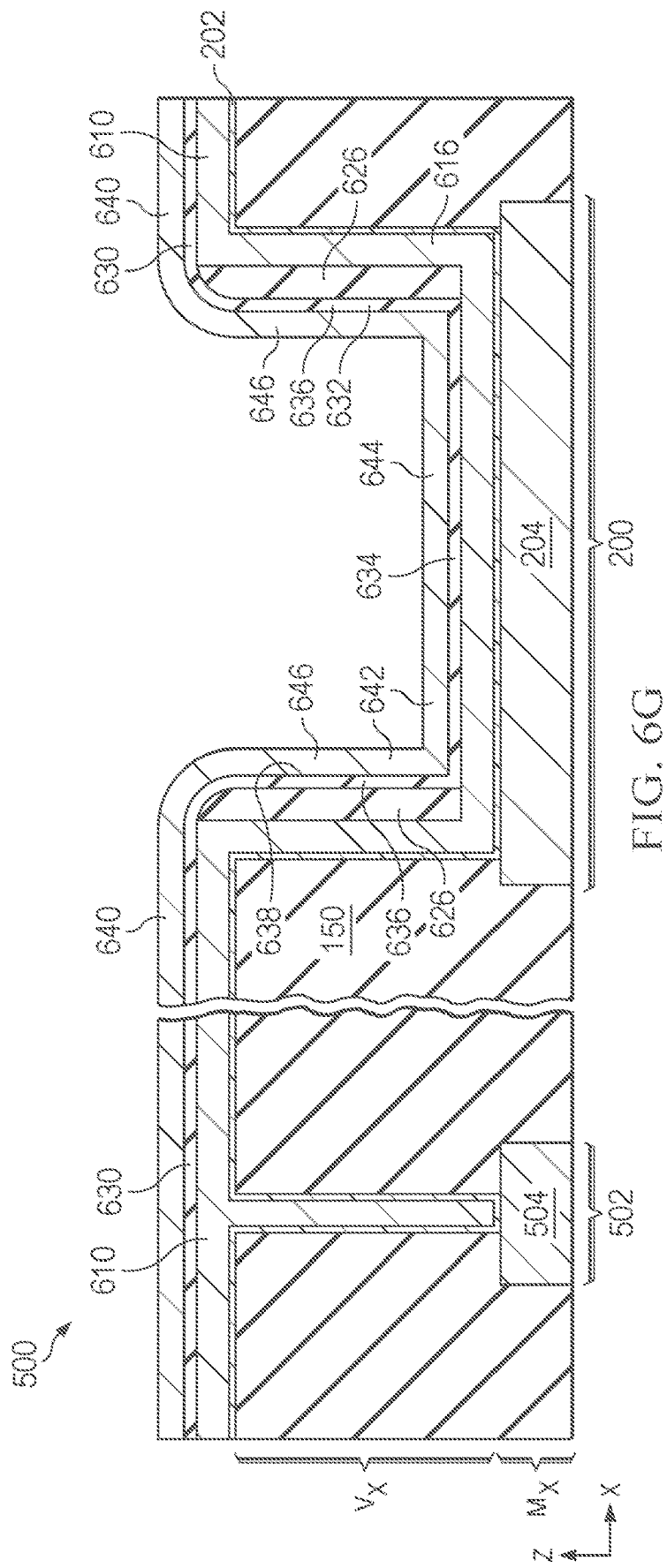
Figure 6H:
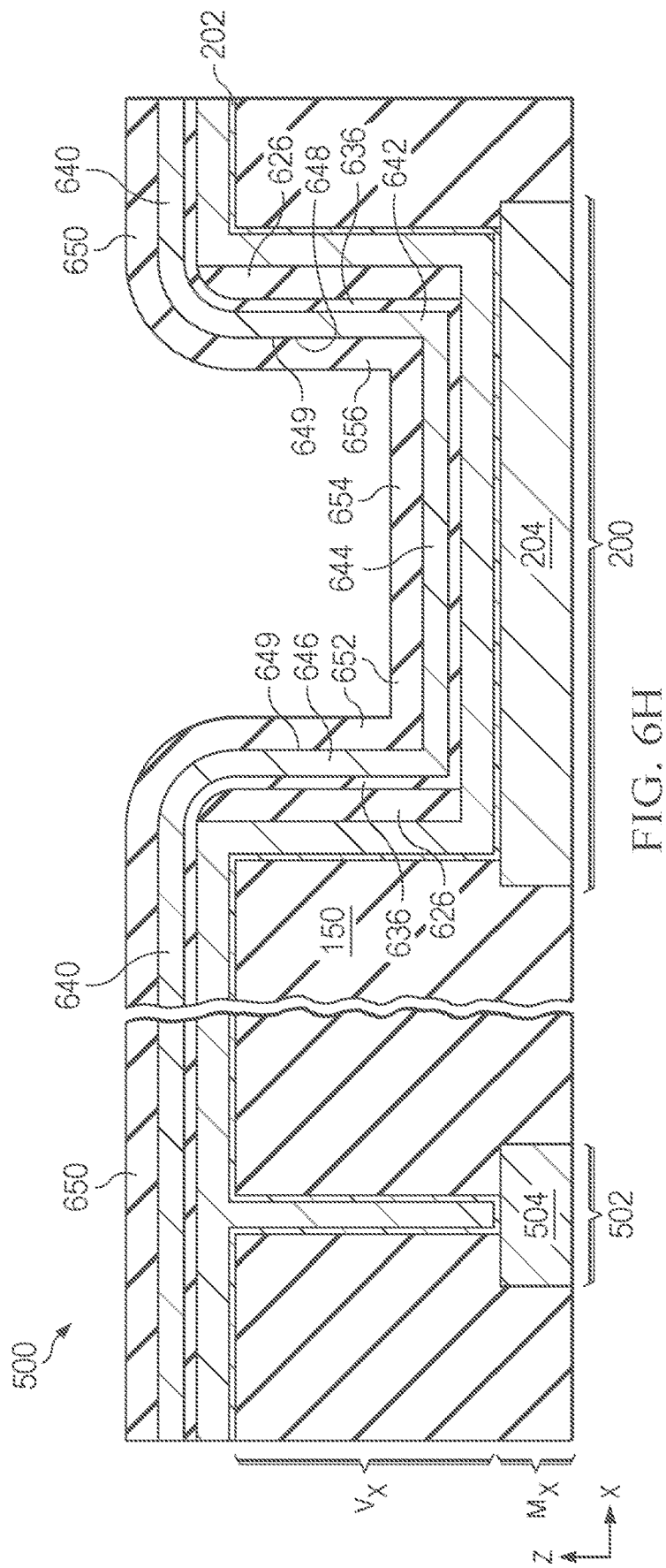
Figure 6I:
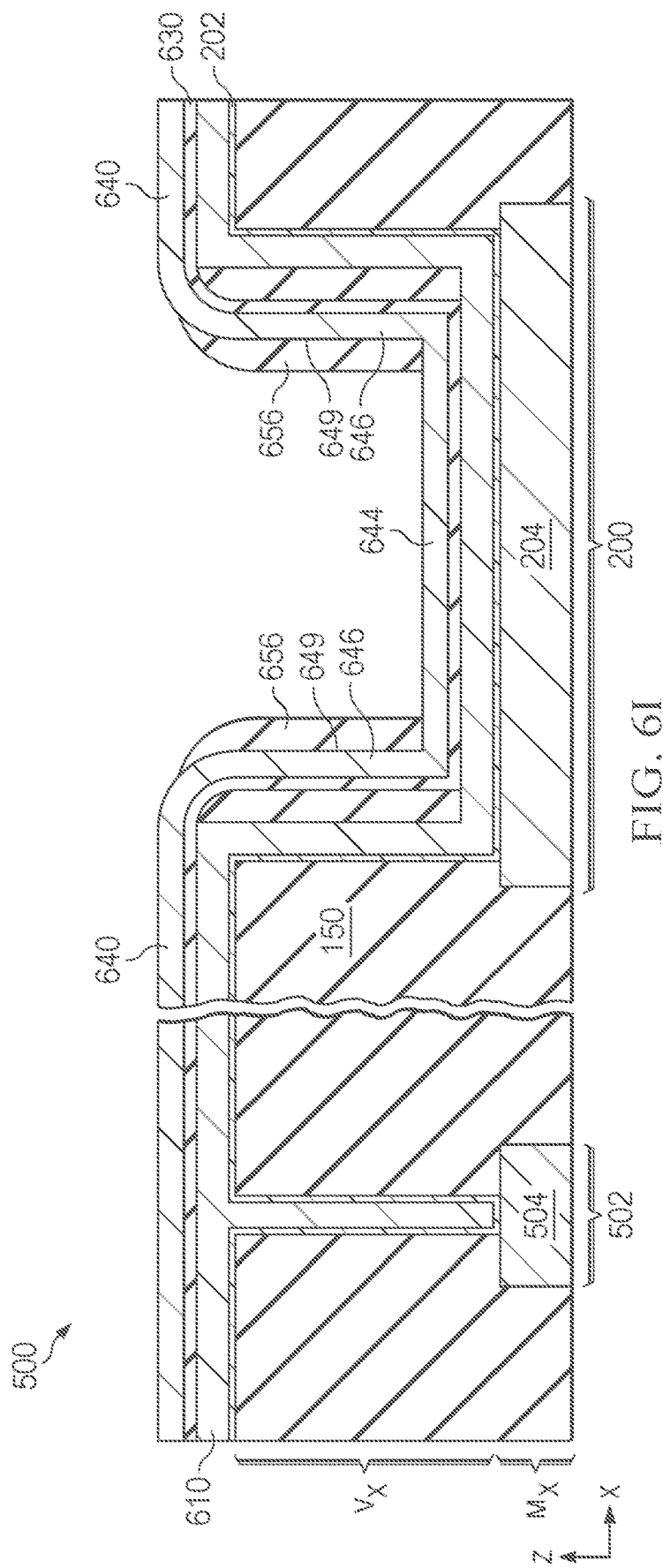
Figure 6J:
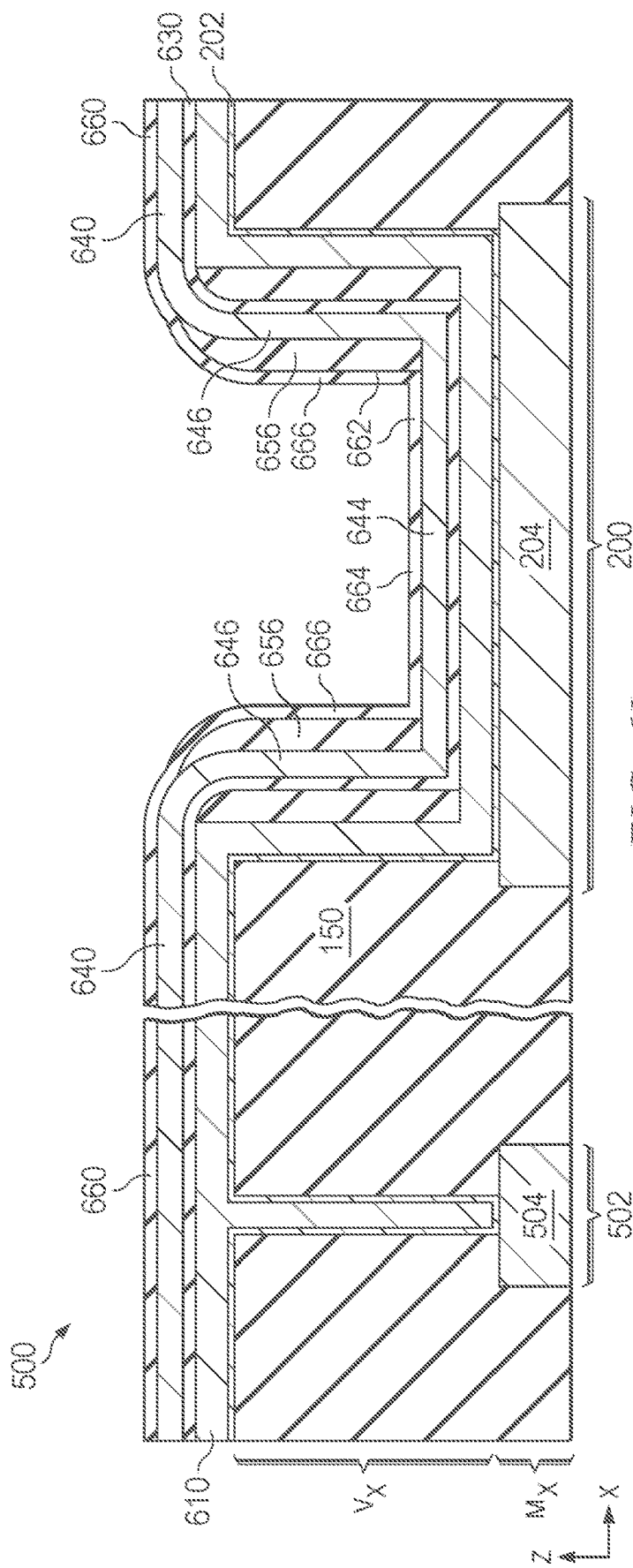
Figure 6M:
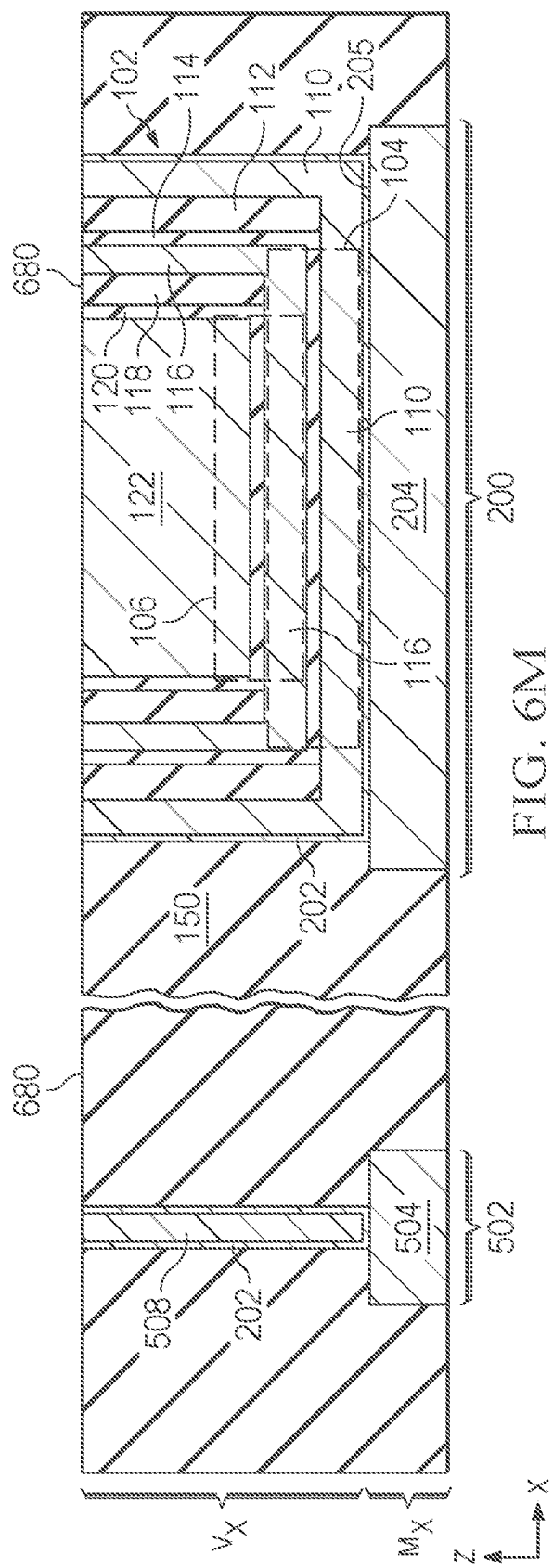
Figure 6N:
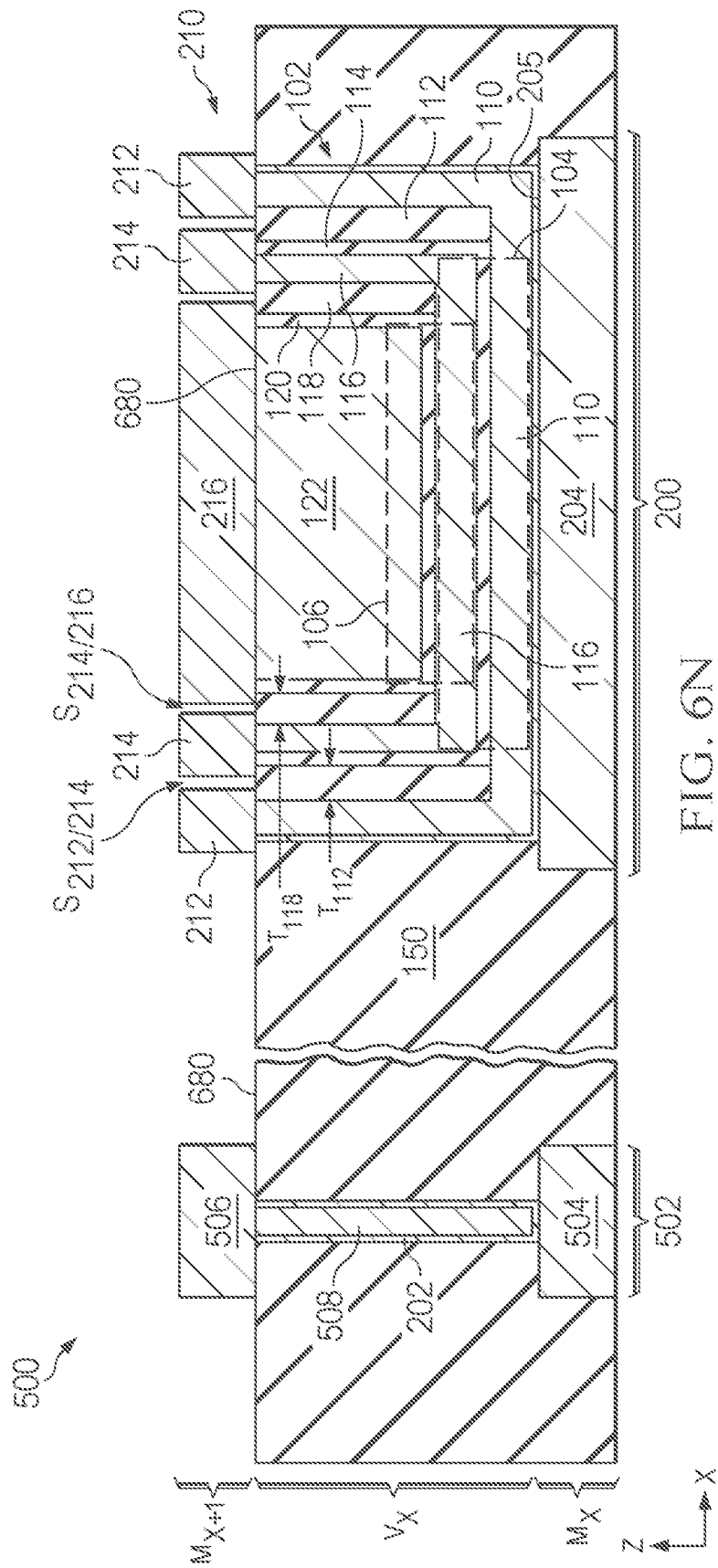

FIGS. 6A-6N show an example method of forming the example IC device 500 shown in FIG. 5, including example multi-capacitor module 200 and example IC structure 502. In some examples, the IC structure 502 may be omitted, such that the multi-capacitor module 200 may be formed by the process described below without the elements of IC structure 502. In the example shown in FIGS. 6A-6N, the multi-capacitor module 200 is formed between two metal interconnect layers $M_x$ and $M_{x+1}$.

As shown in FIG. 6A (top view) and FIG. 6B (cross-sectional side view through line 6B-6B shown in FIG. 6A), the lower IC element 504 and stacked MIM capacitor structure base 204 are formed in lower metal layer $M_x$. In this example, the lower metal layer $M_x$ comprises a metal interconnect layer, wherein the lower IC element 504 and stacked MIM capacitor structure base 204 comprise respective metal elements formed in the metal interconnect layer $M_x$. For example, the lower IC element 504 and stacked MIM capacitor structure base 204 may be formed by depositing, patterning, and etching an aluminum layer.

The dielectric region 150 (e.g., an inter-metal dielectric (IMD) region) is deposited and planarized over the lower IC element 504 and stacked MIM capacitor structure base 204 formed in lower metal layer $M_x$. In some examples, the dielectric region 150 may comprise silicon oxide, phosphosilicate glass (PSG), fluorinated silicate glass (FSG), or a combination thereof. A planarization process (e.g., oxide CMP process) may be performed to planarize a top surface of the dielectric region 150.

A number of dielectric region openings 600, including an IC contact element opening 602 and the tub opening 130, are formed in the dielectric region 150. The dielectric region openings 600 may be formed by masking with photoresist material and using a plasma etch or other suitable etch, followed by a resist strip or other suitable process to remove remaining portions of photoresist material.

In some examples, the IC contact element opening 602 may comprise a via opening having a width (or diameter or Critical Dimension (CD)) $W_{via}$ in both the x-direction and y-direction in the range of 0.1-0.5 μm, for example. In contrast, the tub opening 130 may have a substantially larger width in the x-direction ($W_{tub\_x}$) and/or y-direction ($W_{tub\_y}$) than the IC contact element opening 602. The shape and dimensions of the tub opening 130 may be selected based on various parameters, e.g., for effective manufacturing of the multi-capacitor module 200 (e.g., effective formation of the stacked MIM capacitor structure 102 in the tub opening 130) and/or for desired performance characteristics of the resulting multi-capacitor module 200. In one example, e.g., as shown in FIG. 6B, the tub opening 130 may have a square or rectangular shape from the top view. In other examples, the tub opening 130 may have a circular or oval shape from the top view.

As noted above, a width of the tub opening 130 in the x-direction ($W_{tub\_x}$), y-direction ($W_{tub\_y}$), or both the x-direction and y-direction ($W_{tub\_x}$ and $W_{tub\_y}$) may be substantially larger than the width $W_{via}$ of the IC contact element opening 602 in the x-direction, y-direction, or both the x-direction and y-direction. For example, in some examples, width $W_{tub\_x}$ and $W_{tub\_y}$ of the tub opening 130 are respectively at least twice as large as the width $W_{via}$ of the IC contact element openings 602. In particular examples, width $W_{tub\_x}$ and $W_{tub\_y}$ of the tub opening 130 are respectively at least five time as large or at least 10 times as large as the width $W_{via}$ of the IC contact element opening 602. In some examples, $W_{tub\_x}$ and $W_{tub\_y}$ are respectively in the range of 1-100 μm.

Further, the tub opening 130 may be formed with a height-to-width aspect ratio of less than or equal to 1.0 in both the x-direction and y-direction, e.g., to allow effective filling of the tub opening 130 by respective materials. For example, the tub opening 130 may be formed with aspect ratios $H_{tub}/W_{tub\_x}$ and $H_{tub}/W_{tub\_y}$ respectively in the range of 0.01-1.0, for example in the range of 0.1-1.0. In some examples, aspect ratios $H_{tub}/W_{tub\_x}$ and $H_{tub}/W_{tub\_y}$ are respectively less than or equal to 1.0, e.g., for effective filling of the tub opening 130 by respective materials to form the stacked MIM capacitor structure 102 in the tub opening 130. For example, the tub opening 130 may be formed with aspect ratios $H_{tub}/W_{tub\_x}$ and $H_{tub}/W_{tub\_y}$ respectively in the range of 0.1-1.0, or more particularly in the range of 0.5-1.0.

As shown in FIG. 6C, the liner (or "glue layer") 202, e.g., comprising TiN with a thickness which may be in the range of 50 Å-200 Å, is deposited over the structure and extends into respective dielectric region openings 600. A first conformal metal 610 is deposited over the liner 202 and extends into respective dielectric region openings 600 to (a) fill the IC contact element opening 602 and (b) form a first electrode cup structure 612 in the tub opening 130, the first electrode cup structure 612 including a laterally-extending first electrode cup base 614 and a vertically-extending first electrode cup sidewall 616 extending upwardly from the laterally-extending first electrode cup base 614, e.g., from a perimeter of laterally-extending first electrode cup base 614. In one example, the first conformal metal 610 comprises tungsten deposited with a thickness in the range of 1000 Å-5000 Å. In other examples, the first conformal metal 610 may comprise Co, TiN, or other conformal metal. The first conformal metal 610 may be deposited by a conformal chemical vapor deposition (CVD) process or other suitable deposition process.

As shown in FIG. 6D, a first spacer layer 620 is deposited over the first conformal metal 610 and extends down into an opening 618 defined by the first electrode cup structure 612 to form a first spacer layer cup structure 622 including a laterally-extending first spacer layer cup base 624 and a vertically-extending first spacer layer cup sidewall 626 extending upwardly from the laterally-extending first spacer layer cup base 624, e.g., from a perimeter of laterally-extending first spacer layer cup base 624. The laterally-extending first spacer layer cup base 624 is formed on the laterally-extending first electrode cup base 614, and the vertically-extending first spacer layer cup sidewall 626 is formed on a radially interior surface 619 of the vertically-extending first electrode cup sidewall 616.

In some examples, the first spacer layer 620 comprises silicon oxide ($SiO_2$) or silicon nitride (SiN) deposited by a Plasma Enhanced Chemical Vapor Deposition (PECVD) process. Alternatively, the first spacer layer 620 may comprise fluorinated silicate glass (FSG), organosilicate glass (OSG), porous OSG, or other low-k dielectric material (e.g., having a dielectric constant less than 3.6). The first spacer layer 620 may be deposited with a thickness sufficient to allow the subsequently-formed first electrode connection element 212 and second electrode connection element 214 to be formed spaced apart from each other (without shorting) while still covering their corresponding underlying structures, based on a minimum critical dimension associated with the relevant manufacturing process, e.g., a metal etch process used to form the first electrode connection element 212 and second electrode connection element 214, as shown in FIG. 6N. For example, first spacer layer 620 may be deposited with a thickness in the range of 2500 Å-5000 Å.

As shown in FIG. 6E, a first anisotropic etch (e.g., anisotropic plasma etch) is performed to remove the laterally-extending first spacer layer cup base 624, exposing an upper surface of the laterally-extending first electrode cup base 614, while leaving the vertically-extending first spacer layer cup sidewall 626 at least partially intact. The vertically-extending first spacer layer cup sidewall 626 may exhibit a sloped edge at an upper extension thereof as a result of the first anisotropic etch. The first anisotropic etch removes any portion of the first spacer layer 620 remaining over first conformal metal 610, exposing first conformal metal 610, with the exception of the vertically-extending first spacer layer cup sidewall 626 indicated above.

As shown in FIG. 6F, a first insulator layer 630 is deposited over the first conformal metal 610 and over the first spacer sidewall 626 to form a first insulator cup structure 632 including a laterally-extending first insulator cup base 634 and a vertically-extending first insulator cup sidewall 636 extending upwardly from the laterally-extending first insulator cup base 634, e.g., from a perimeter of laterally-extending first insulator cup base 634. In some examples, the first insulator layer 630 comprises SiN deposited with a thickness in the range of 250 Å-750 Å by a PECVD process. Alternatively, the first insulator layer 630 may comprise $Al_2O_3$, $ZrO_2$, $HfO_2$, $ZrSiO_x$, $HfSiO_x$, $HfAlO_x$, or $Ta_2O_5$, or other suitable high-k dielectric material (e.g., having a dielectric constant k greater than 7) deposited using an Atomic Layer Deposition (ALD) process.

As shown in FIG. 6G, a second conformal metal 640 is deposited over the first insulator layer 630 and extends into an opening 638 defined by the first insulator cup structure 632 to form a second electrode cup structure 642 in the opening 638. The second electrode cup structure 642 includes a laterally-extending second electrode cup base 644 and a vertically-extending second electrode cup sidewall 646 extending upwardly from the laterally-extending second electrode cup base 644, e.g., from a perimeter of laterally-extending second electrode cup base 644. In one example, the second conformal metal 640 comprises titanium nitride (TiN), titanium nitride (TiN) plus tungsten (W), or other conformal metal, deposited with a thickness in the range of 1000 Å-5000 Å.

As shown in FIG. 6H, a second spacer layer 650 is deposited over the second conformal metal 640 and extends down into an opening 648 defined by the second electrode cup structure 642 to form a second spacer layer cup structure 652 including a laterally-extending second spacer layer cup base 654 and a vertically-extending second spacer layer cup sidewall 656 extending upwardly from the laterally-extending second spacer layer cup base 654, e.g., from a perimeter of laterally-extending second spacer layer cup base 654. The laterally-extending second spacer layer cup base 654 is formed on the laterally-extending second electrode cup base 644, and the vertically-extending second spacer layer cup sidewall 656 is formed on a radially interior surface 649 of the vertically-extending second electrode cup sidewall 646.

In some examples, the second spacer layer 650 comprises $SiO_2$ or SiN deposited by a PECVD process. Alternatively, the second spacer layer 650 may comprise FSG, OSG, porous OSG, or other low-k dielectric material (e.g., having a dielectric constant less than 3.6). The second spacer layer 650 may be deposited with a thickness sufficient to allow the subsequently-formed second electrode connection element 214 and third electrode connection element 216 to be formed spaced apart from each other (without shorting) while still covering their corresponding underlying structures, based on a minimum critical dimension associated with the relevant manufacturing process, e.g., a metal etch process used to form the second electrode connection element 214 and third electrode connection element 216, as shown in FIG. 6N. For example, second spacer layer 650 may be deposited with a thickness in the range of 2500 Å-5000 Å.

As shown in FIG. 6I, a second anisotropic etch (e.g., anisotropic plasma etch) is performed that removes the laterally-extending second spacer layer cup base 654, exposing an upper surface of the laterally-extending second electrode cup base 644, while leaving the vertically-extending second spacer layer cup sidewall 656 at least partially intact. The vertically-extending second spacer layer cup sidewall 656 may exhibit a sloped edge at an upper extension thereof as a result of the second anisotropic etch. The second anisotropic etch removes any portion of the second spacer layer 650 remaining over second conformal metal 640, exposing first conformal metal 640, with the exception of the vertically-extending second spacer layer cup sidewall 656 indicated above As shown in FIG. 6J, a second insulator layer 660 is deposited over the second conformal metal 640 and over the second spacer sidewall 656 to form a second insulator cup structure 662 including a laterally-extending second insulator cup base 664 and a vertically-extending second insulator cup sidewall 666 extending upwardly from the laterally-extending second insulator cup base 664, e.g., from a perimeter of laterally-extending second insulator cup base 664. In some examples, the second insulator layer 630 comprises SiN deposited with a thickness in the range of 250 Å-750 Å by a PECVD process. Alternatively, the second insulator layer 660 may comprise $Al_2O_3$, $ZrO_2$, $HfO_2$, $ZrSiO_x$, $HfSiO_x$, $HfAlO_x$, or $Ta_2O_5$, or other suitable high-k dielectric material (e.g., having a dielectric constant k greater than 7) deposited using an ALD process.

As shown in FIG. 6K, a third electrode metal 670 is deposited over the second insulator layer 660 and extends into an opening 668 defined by the second insulator cup structure 662 to form a third electrode structure 672 filling the opening 668. In some examples, the third electrode metal 670 comprises titanium nitride (TiN), aluminum, tungsten, or a combination thereof, for example TiN and aluminum, deposited by Physical Vapor Deposition (PVD), for example.

As shown in FIG. 6L (top view) and FIG. 6M (cross-sectional side view through line 6M-6M shown in FIG. 6L), a planarization process is performed to remove (a) upper portions of the third electrode metal 670, (b) upper portions of the second insulator layer 660, (c) upper portions of the second spacer layer cup sidewall 656 (e.g., including the upper portion having the sloped edge), (d) upper portions of the second conformal metal 640, (e) upper portions of the first insulator layer 630, (f) upper portions of the first spacer layer cup sidewall 626 (e.g., including the upper portion having the sloped edge), (g) upper portions of the first conformal metal 610, ad (h) upper portions of the liner 202, resulting in the structure shown in FIGS. 6L and 6M. The planarization process defines a planarized upper surface 680 of via layer $V_x$. In some examples the planarization process comprises a chemical mechanical planarization (CMP) process.

After the planarization process, a remaining portion of the first conformal metal 610 defines the cup-shaped first electrode 110, a remaining portion of the first spacer layer cup sidewall 626 defines the first sidewall spacer 112, a remaining portion of the first insulator layer 630 defines the cup-shaped first insulator 114, a remaining portion of the second conformal metal 640 defines the cup-shaped second electrode 116, a remaining portion of the second spacer layer cup sidewall 656 defines the second sidewall spacer 118, a remaining portion of the second insulator layer 660 defines the cup-shaped second insulator 120, and a remaining portion of the third electrode metal 670 defines the third electrode 122.

Also, after the planarization process, a remaining portion of the first conformal metal 610 in the IC contact element opening 602 defines the vertically-extending IC contact element 508 of the example IC structure 502.

As shown in FIG. 6N, the upper IC element 506, the first electrode connection element 212, the second electrode connection element 214, and the third electrode connection element 216 may be formed in the upper metal layer $M_{x+1}$, for example, by depositing, patterning, and etching a metal layer (e.g., an aluminum interconnect layer). As discussed above, a lateral thickness $T_{112}$ of the first sidewall spacer 112 is sufficient to allow the first electrode connection element 212 and second electrode connection element 214 to be sufficiently spaced apart by a distance $S_{212/214}$ to avoid electrical shorting, e.g., accounting for metal etch process margins. Similarly, a lateral thickness $T_{118}$ of the second sidewall spacer 118 is sufficient to allow the second electrode connection element 214 and third electrode connection element 216 to be sufficiently spaced apart by a distance $S_{214/216}$ to avoid electrical shorting, e.g., accounting for metal etch process margins.

As discussed above, in other examples the first sidewall spacer 112 may be formed between the vertically-extending second electrode sidewall 116*b* and the vertically-extending first insulator sidewall 114*b*, and the second sidewall spacer 118 may be formed between the third electrode 122 and the vertically-extending second insulator sidewall 120*b*. In such examples, the first insulator layer 630 may be deposited prior to the first spacer layer 620, and the second insulator layer 660 may be deposited prior to the second spacer layer 650. However, forming the first and second sidewall spacers 626 and 656 from the first and spacer layers 620 and 650, respectively, may require additional or more costly process steps (e.g., additional deposition steps, etch steps, etc.), for example due to the difficulty of etching the laterally-extending first spacer layer cup base 624 and laterally-extending second spacer layer cup base 654 without etching the underlying portions of the first insulator layer 630 and second insulator layer 660, respectively.

FIG. 7 is a cross-sectional side view of an example IC device 700 including an example multi-capacitor module 702 including the stacked MIM capacitor structure 102, and an example interconnect structure 704, formed between a silicided polysilicon layer $M_0$ and a first metal interconnect layer $M_1$ (metal-1). The stacked MIM capacitor structure 102 of the multi-capacitor module 702 is formed on a stacked MIM capacitor structure base 710 formed in the silicided polysilicon layer $M_0$. The interconnect structure 704 includes a lower IC element 714 formed in the silicided polysilicon layer $M_0$, an upper IC element 506 formed in the first metal interconnect layer $M_1$, and a vertically-extending IC contact element 718 formed in a via layer $V_0$ (also referred to as a contact layer) between the silicided polysilicon layer $M_0$ and first metal interconnect layer $M_1$.

The stacked MIM capacitor structure base 710 may comprise a first metal silicide region 722 formed on a first polysilicon region 720, and the lower IC element 714 may comprise a second metal silicide region 726 formed on a second polysilicon region 724. In some examples, metal silicide regions 722 and 726 may comprise titanium silicide, cobalt silicide, or nickel silicide.

FIG. 8 is a cross-sectional side view of an IC device 800 including an example multi-capacitor module 802 formed concurrently with an example IC structure 804, wherein the multi-capacitor module 802 includes stacked MIM capacitor structure 102 formed in a via layer $V_0$ between a shallow trench isolation (STI) oxide region 808 and a first metal interconnect layer $M_1$ (metal-1). In this example, the IC structure 804 includes a transistor structure 810 including a polysilicon gate 812 formed over a gate oxide 813 and having a metal silicide region 814 formed thereon. The IC structure 504 may include a vertically-extending IC contact 818 electrically connected to the metal silicide region 814, and an upper IC element 506 formed in the first metal interconnect layer $M_1$. An optional etch stop layer 820 (e.g., comprising silicon nitride) may be formed over the STI oxide region 808 and extending over the polysilicon gate 812.

In the example multi-capacitor modules shown in the drawings and discussed above, the stacked MIM capacitor structures include two capacitors arranged in a stacked manner. In other examples, the multi-capacitor module may include three, four, or more stacked capacitors formed in the stacked MIM capacitor structure, e.g., by depositing additional insulator layers, electrode layers, and/or spacer layers in the tub opening according to the process described herein.

The invention claimed is:

1. A multi-capacitor module, comprising:
a stacked metal-insulator-metal (MIM) structure including:
a cup-shaped first electrode;
a cup-shaped first insulator formed over the cup-shaped first electrode;
a cup-shaped second electrode formed over the cup-shaped first insulator;
a cup-shaped second insulator formed over the cup-shaped second electrode;
a third electrode formed over the cup-shaped second insulator;
a first sidewall spacer located between a vertically-extending first electrode sidewall of the cup-shaped first electrode and a vertically-extending first insulator sidewall of the cup-shaped first insulator;
a second sidewall spacer located between a vertically-extending second electrode sidewall of the cup-shaped second electrode and a vertically-extending second insulator sidewall of the cup-shaped second insulator;
wherein the cup-shaped first electrode, the cup-shaped second electrode, and the cup-shaped first insulator define a first capacitor; and
wherein the cup-shaped second electrode, the third electrode, and the cup-shaped second insulator define a second capacitor.

2. The MIM capacitor module of claim 1, wherein:
the cup-shaped first electrode includes a laterally-extending first electrode base and the vertically-extending first electrode sidewall extending upwardly from the laterally-extending first electrode base;
the first cup-shaped insulator includes a laterally-extending first insulator base and the vertically-extending first insulator sidewall extending upwardly from the laterally-extending first insulator base;
the cup-shaped second electrode includes a laterally-extending second electrode base and the vertically-extending second electrode sidewall extending upwardly from the laterally-extending second electrode base; and
the second cup-shaped insulator includes a laterally-extending second insulator base and the vertically-extending second insulator sidewall extending upwardly from the laterally-extending second insulator base.

3. The MIM capacitor module of claim 2, wherein:
the first capacitor comprises a first planar capacitor defined by the laterally-extending second electrode base, the laterally-extending first insulator base, and the laterally-extending first electrode base; and
the second capacitor comprises a second planar capacitor defined by the third electrode, the laterally-extending second insulator base, and the laterally-extending second electrode base.

4. The MIM capacitor module of claim 1, comprising:
a first electrode connection element electrically connected to the vertically-extending first electrode sidewall;
a second electrode connection element electrically connected to the vertically-extending second electrode sidewall; and
a third electrode connection element electrically connected to the third electrode.

5. The MIM capacitor module of claim 4, wherein the first electrode connection element, the second electrode connection element, and the third electrode connection element are formed in a common metal layer.

6. The MIM capacitor module of claim 4, comprising:
a stacked MIM capacitor structure base formed in a lower metal layer, wherein the stacked MIM capacitor structure is formed on the stacked MIM capacitor structure base; and
wherein the first electrode connection element, the second electrode connection element, and the third electrode connection element are formed in an upper metal layer.

7. The MIM capacitor module of claim 6, wherein the lower metal layer and upper metal layer comprise respective metal interconnect layers.

8. The MIM capacitor module of claim 6, wherein the lower metal layer comprises a silicided polysilicon layer, wherein the stacked MIM capacitor structure base comprises a metal silicide region formed on a polysilicon structure.

9. The MIM capacitor module of claim 1, wherein the stacked MIM capacitor structure base is formed between a shallow trench isolation (STI) field oxide region and a metal interconnect layer.

10. The MIM capacitor module of claim 1, wherein the first capacitor and the second capacitor are electrically connected in series by respective electrode connection elements.

11. The MIM capacitor module of claim 1, wherein the first capacitor and the second capacitor are electrically connected in parallel by respective electrode connection elements.

12. An integrated circuit (IC) device, comprising:
an IC structure comprising:
a lower IC element;
an upper IC element; and
a vertically-extending IC contact element formed in a dielectric region and conductively connected between the lower IC element and the upper IC element; and
a multi-capacitor module, comprising:
a stacked metal-insulator-metal (MIM) structure formed in a tub opening in the dielectric region, the stacked MIM capacitor structure including:
a cup-shaped first electrode;
a cup-shaped first insulator formed over the cup-shaped first electrode;
a cup-shaped second electrode formed over the cup-shaped first insulator;
a cup-shaped second insulator formed over the cup-shaped second electrode;
a third electrode formed over the cup-shaped second insulator;
a first sidewall spacer located between the cup-shaped first electrode and the cup-shaped second electrode;
a second sidewall spacer located between the cup-shaped second electrode and the third electrode;
wherein the cup-shaped first electrode, the cup-shaped second electrode, and the cup-shaped first insulator define a first capacitor; and
wherein the cup-shaped second electrode, the third electrode, and the cup-shaped second insulator define a second capacitor; and
a third electrode connection element electrically connected to the third electrode;
wherein the third electrode connection element and the upper IC element are formed in a common metal layer.

13. The IC device of claim 12, wherein the multi-capacitor module comprises:
a first electrode connection element electrically connected to the vertically-extending first electrode sidewall; and
a second electrode connection element electrically connected to the vertically-extending second electrode sidewall;
wherein the lower IC element is formed in a lower metal layer; and
wherein the first electrode connection element, the second electrode connection element, and the third electrode connection element are formed in an upper metal layer.

14. The IC device of claim 12, wherein:
the stacked MIM capacitor structure is formed on a stacked MIM capacitor structure base;
the stacked MIM capacitor structure base and the lower IC element are formed in a lower metal layer; and
the third electrode connection element and the upper IC element are formed in an upper metal layer.

15. The IC device of claim 14, wherein the lower metal layer and the upper metal layer comprise respective metal interconnect layers.

16. The IC device of claim 14, wherein:
the lower metal layer comprises a silicided polysilicon layer, wherein the lower IC element and the stacked MIM capacitor structure base respectively comprise a respective metal silicide region formed on a respective polysilicon structure; and
the upper metal layer comprises a metal interconnect layer.

17. The IC device of claim 12, wherein the stacked MIM capacitor structure is formed on a shallow trench isolation (STI) field oxide region.

18. The IC device of claim 12, wherein the vertically-extending IC contact element and the cup-shaped first electrode are formed from a common conformal metal.

19. A method, comprising:
forming a tub opening in a dielectric region;
depositing a first conformal metal in the tub opening;
forming a first sidewall spacer structure;
after forming the first sidewall spacer structure, depositing a first insulator layer over the first conformal metal and over the first sidewall spacer structure;
depositing a second conformal metal over the first insulator layer;
forming a second sidewall spacer;
after forming the second sidewall spacer structure, depositing a second insulator layer over the second conformal metal and over the second sidewall spacer structure;
depositing a second insulator layer over the second insulator layer;
depositing a third electrode metal over the second insulator layer; and
performing a planarization process defining a stacked metal-insulator-metal (MIM) structure in the tub opening.

20. The method of claim 19, wherein:
the deposited first conformal metal defines a cup-shaped first electrode structure including a laterally-extending first electrode base and a vertically-extending first electrode sidewall extending upwardly from the laterally-extending first electrode base; and
forming the first sidewall spacer structure comprises:
depositing a first spacer layer forming a first spacer layer cup structure including a laterally-extending first spacer layer cup base and a vertically-extending first spacer layer cup sidewall extending upwardly from the laterally-extending first spacer layer cup base; and
performing an anisotropic etch removing the laterally-extending first spacer layer cup base and exposing an upper surface of the laterally-extending first electrode base.

21. The method of claim 19, wherein after the planarization process:
a remaining portion of the first conformal metal defines a cup-shaped first electrode;
a remaining portion of the first sidewall spacer structure defines a first sidewall spacer;
a remaining portion of the first insulator layer defines a cup-shaped first insulator;
a remaining portion of the second conformal metal defines a cup-shaped second electrode;
a remaining portion of the second sidewall spacer structure defines a second sidewall spacer;
a remaining portion of the second insulator layer defines a cup-shaped second insulator; and a remaining portion of the third electrode metal defines a third electrode in an opening defined by the cup-shaped second insulator.

22. The method of claim 21, comprising forming a metal layer including:
- a first electrode connection element electrically connected to the cup-shaped first electrode;
- a second electrode connection element electrically connected to cup-shaped second electrode; and
- a third electrode connection element electrically connected to the third electrode.

23. A multi-capacitor module, comprising:
- a first capacitor including a first cup-shaped insulator arranged between a first electrode and a second electrode;
- a second capacitor including a second cup-shaped insulator arranged between the second electrode and a third electrode;
- wherein the first cup-shaped insulator includes a laterally-extending first insulator base and a vertically-extending first insulator sidewall extending upwardly from the laterally-extending first insulator base; and
- a first dielectric sidewall spacer adjacent the first vertically-extending first insulator sidewall, the first dielectric sidewall spacer preventing or reducing a capacitive coupling between the first electrode and the second electrode through the first vertically-extending insulator sidewall.

* * * * *